ис010860156B2

(12) United States Patent
Moon et al.

(10) Patent No.: US 10,860,156 B2
(45) Date of Patent: Dec. 8, 2020

(54) ELECTRONIC DEVICE

(71) Applicant: SAMSUNG DISPLAY CO., LTD., Yongin-si (KR)

(72) Inventors: Dongjin Moon, Cheonan-si (KR); Inyoung Han, Hwaseong-si (KR); Hyeyun Han, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/503,969

(22) Filed: Jul. 5, 2019

(65) Prior Publication Data
US 2020/0057530 A1 Feb. 20, 2020

(30) Foreign Application Priority Data

Aug. 14, 2018 (KR) ........................ 10-2018-0095076

(51) Int. Cl.
G06F 3/044 (2006.01)
G06F 3/041 (2006.01)
H01L 27/32 (2006.01)

(52) U.S. Cl.
CPC .......... *G06F 3/0446* (2019.05); *G06F 3/0412* (2013.01); *G06F 3/0443* (2019.05); (Continued)

(58) Field of Classification Search
CPC .... G06F 3/0446; G06F 3/0443; G06F 3/0412; G06F 2203/04107; G06F 2203/04111; H01L 27/323; H01L 27/3276
See application file for complete search history.

(56) References Cited

U.S. PATENT DOCUMENTS

2016/0103548 A1 4/2016 Jun
2016/0239131 A1 8/2016 Kang
(Continued)

FOREIGN PATENT DOCUMENTS

CN 108132732 6/2016
CN 107340942 11/2017
(Continued)

OTHER PUBLICATIONS

Ye, "A kind of touch screen and mobile terminal" machine translation of CN 108132732 A, Jun. 8, 2018 (Year: 2018).*
(Continued)

*Primary Examiner* — Peter D McLoone
(74) *Attorney, Agent, or Firm* — F. Chau & Associates, LLC

(57) ABSTRACT

An electronic device includes a plurality of row electrodes including first and second row electrodes, which have first and second lengths, respectively, in a first direction, and a plurality of column electrodes including first and second column electrodes, which are adjacent to each other in the first direction and have third and fourth lengths, respectively, in a second direction. The device further includes a plurality of first lines connected to ends of the row electrodes, respectively, a plurality of second lines connected to ends of the column electrodes, respectively, and a plurality of third lines connected to opposite ends of the column electrodes, respectively. The second and fourth lengths are longer than the first and third lengths, respectively, and the first to third lines are spaced apart from each other when viewed in a plan view.

29 Claims, 16 Drawing Sheets

(52) U.S. Cl.
CPC ........ *H01L 27/323* (2013.01); *H01L 27/3276* (2013.01); *G06F 2203/04107* (2013.01); *G06F 2203/04111* (2013.01)

(56) References Cited

U.S. PATENT DOCUMENTS

| | | |
|---|---|---|
| 2017/0237037 A1 | 8/2017 | Choi et al. |
| 2017/0336909 A1 | 11/2017 | Song et al. |
| 2018/0129330 A1 | 5/2018 | Ding et al. |
| 2018/0188584 A1* | 7/2018 | Yeh ...................... G02F 1/1339 |
| 2019/0286272 A1* | 9/2019 | Feng .................... G06F 3/0412 |
| 2020/0083299 A1* | 3/2020 | Kim ................... H01L 51/5284 |

FOREIGN PATENT DOCUMENTS

| | | |
|---|---|---|
| KR | 1020160101295 | 8/2016 |
| KR | 1020170095444 | 8/2017 |
| KR | 1020170131786 | 11/2017 |

OTHER PUBLICATIONS

Extended European Search Report dated Nov. 21, 2019 in Corresponding European Application No. 19191242.7.

\* cited by examiner

ELECTRONIC DEVICE

CROSS-REFERENCE TO RELATED APPLICATIONS

This application claims priority under 35 U.S.C. § 119 to Korean Patent Application No. 10-2018-0095076, filed on Aug. 14, 2018 in the Korean Intellectual Property Office, the disclosure of which is incorporated by reference herein in its entirety.

TECHNICAL FIELD

Exemplary embodiments of the present inventive concept relate to an electronic device, and more particularly, to an electronic device including an input sensing unit.

DISCUSSION OF THE RELATED ART

An electronic device is activated by an electrical signal. The electronic device includes various electronic components, such as a display unit for displaying an image and an input sensing unit for sensing an external input. The electronic components are electrically connected to each other through signal lines.

The number of the signal lines may be changed depending on the number or operation environment of the electronic components, and the signal lines may be arranged in an appropriate space of a predetermined panel region to prevent electrical interference between electrical signals from occurring. The signal lines receive electrical signals, which are provided from the outside, through pads. As an operation speed of the electronic device or an amount of data processed by the electronic device increases, it is necessary to increase the numbers of the signal lines and the pads, which may make it more difficult to prevent electrical interference between the electronic components or the signal lines.

SUMMARY

An exemplary embodiment of the inventive concept provides an electronic device whose input sensitivity is prevented from being deteriorated by electrical interference between electrical signals.

According to an exemplary embodiment of the inventive concept, an electronic device include a plurality of row electrodes extending in a first direction and arranged in a second direction crossing the first direction. The plurality of row electrodes includes a first row electrode and a second row electrode disposed adjacent to each other in the second direction, and having a first length and a second length, respectively, in the first direction. The second length is longer than the first length. The electronic device further includes a plurality of column electrodes extending in the second direction and arranged in the first direction. The plurality of column electrodes includes a first column electrode and a second column electrode disposed adjacent to each other in the first direction and having a third length and a fourth length, respectively, in the second direction. The fourth length is longer than the third length. The electronic device further includes a plurality of first lines connected to ends of the row electrodes, respectively, a plurality of second lines connected to ends of the column electrodes, respectively, and a plurality of third lines connected to opposite ends of the column electrodes, respectively. The first to third lines are spaced apart from each other when viewed in a plan view.

In an exemplary embodiment, an end of the first row electrode and an end of the second row electrode are aligned with each other along the second direction, and an opposite end of the first column electrode and an opposite end of the second column electrode are aligned with each other along the first direction.

In an exemplary embodiment, the first lines and the second lines are disposed on a same layer.

In an exemplary embodiment, each of the row electrodes includes a plurality of first sensing patterns arranged in the first direction and a plurality of first bridge patterns connecting the first sensing patterns to each other. Each of the column electrodes includes a plurality of second sensing patterns arranged in the second direction and a plurality of second bridge patterns disposed on a different layer than the first bridge patterns and connecting the second sensing patterns to each other. The second lines and the second sensing patterns are disposed on a same layer.

In an exemplary embodiment, the second line and each of the second sensing patterns have an integral shape.

In an exemplary embodiment, the second line is disposed on a same layer as one of the first bridge patterns and the second bridge patterns.

In an exemplary embodiment, the electronic device further includes a reference line receiving a voltage different from those of the first line to third lines. The reference line is spaced apart from the first to third lines when viewed in a plan view.

In an exemplary embodiment, the electronic device further includes a guard line receiving a voltage different from those of the first lines, the second lines, the third lines, and the reference line. The guard line includes at least one of a first guard line disposed between one of the first lines and one of the second lines, which are adjacent to each other, a second guard line disposed between the reference line and one of the first lines adjacent to the reference line, a third guard line disposed between the reference line and one of the second lines adjacent to the reference line, and a fourth guard line disposed between the row electrodes and one of the second lines adjacent to the row electrodes.

In an exemplary embodiment, the fourth guard line is spaced apart from an opposite end of the first row electrode and is adjacent to an opposite end of the second row electrode.

In an exemplary embodiment, the electronic panel further includes a display panel unit that displays an image, a plurality of first pads connected to the first lines, respectively, a plurality of second pads connected to the second lines, respectively, a plurality of third pads connected to the third lines, respectively, and a plurality of display pads connected to the display panel unit.

In an exemplary embodiment, the first pads and the second pads are spaced apart from each other in the first direction with the display pads interposed therebetween, and are respectively disposed on two opposite sides of a display pad region in which the display pads are disposed.

In an exemplary embodiment, the first pads and the second pads are disposed on one side of a display pad region in which the display pads are disposed.

In an exemplary embodiment, a notch region, which faces an opposite end of the first row electrode and an end of the second column electrode, is spaced apart from the column electrodes and the row electrodes when viewed in a plan view.

In an exemplary embodiment, the notch region has a length corresponding to a difference between the first length and the second length in the first direction, and a width corresponding to a difference between the third length and the fourth length in the second direction.

In an exemplary embodiment, an image is not displayed in the notch region.

According to an exemplary embodiment of the inventive concept, an electronic device includes an electronic panel, in which a notch portion providing a notch region is defined, and an electronic component overlapped with the notch region when viewed in a plan view. The electronic panel includes a first row electrode extending in a first direction and including an end and an opposite end, which is opposite to the end and is adjacent to the notch portion, a first column electrode extending in a second direction crossing the first direction and including an end adjacent to the notch portion and an opposite end opposite to the end, a first sensing line connected to the first row electrode, a second sensing line connected to the end of the first column electrode, and a third sensing line connected to the opposite end of the first column electrode. The first sensing line is connected to the end of the first row electrode and is spaced apart from the second sensing line and the third sensing line in a plan view.

In an exemplary embodiment, at least a portion of the second sensing line is adjacent to the notch portion.

In an exemplary embodiment, at least a portion of the second sensing line is adjacent to the opposite end of the first row electrode.

In an exemplary embodiment, the first sensing line and the second sensing line are disposed on a same layer.

In an exemplary embodiment, the first row electrode includes a plurality of first sensing patterns are arranged in the first direction and a plurality of first bridge patterns connecting the first sensing patterns to each other. The first column electrode includes a plurality of second sensing patterns arranged in the second direction and a plurality of second bridge patterns disposed on a different layer than the first bridge patterns and connecting the second sensing patterns to each other. The first sensing line and the first sensing pattern are disposed on a same layer, and the second sensing line and the second sensing pattern are disposed on a same layer.

In an exemplary embodiment, the first sensing line and at least one of the first sensing patterns have an integral shape.

In an exemplary embodiment, the first sensing line covers at least a portion of at least one of the first sensing patterns.

In an exemplary embodiment, the electronic device includes a base substrate, and the base substrate includes a first side and a second side extending parallel to each other and facing each other, and a third side and a fourth side extending parallel to each other and facing each other. The first and second sides extend in the first direction, and the third and fourth sides extend in the second direction. The notch portion is connected to the first side and the fourth side, the first side has a length shorter than the second side, and the fourth side has a length shorter than the third side.

In an exemplary embodiment, the electronic component includes at least one of an imaging component, a sound output component, a light-sensing component, and a heat-sensing component.

According to an exemplary embodiment of the inventive concept, an electronic device includes an electronic panel, in which a notch portion providing a notch region is defined, and an electronic component. The electronic panel includes a display panel unit that displays an image and an input sensing unit disposed on the display panel unit. The electronic component is overlapped with the notch region when viewed in a plan view. The input sensing unit includes a first electrode extending in a first direction and including an end adjacent to the notch portion and an opposite end opposite to the end, a second electrode extending in a second direction crossing the first electrode and including an end adjacent to the notch portion and an opposite end opposite to the end, a first sensing line connected to the first electrode, and a second sensing line connected to the second electrode. The first sensing line is spaced apart from the notch portion with the first electrode interposed therebetween, and the second sensing line is disposed between the notch portion and the second electrode.

In an exemplary embodiment, the electronic device further includes a third sensing line connected to the second electrode. The third sensing line is spaced apart from the notch portion and is connected to the opposite end of the second electrode.

In an exemplary embodiment, the first to third sensing lines are not overlapped with each other when viewed in a plan view.

In an exemplary embodiment, the first sensing line and the second sensing line are disposed on a same layer.

In an exemplary embodiment, the electronic device further includes a plurality of display panel pads connected to the display panel unit, a first pad connected to the first sensing line, a second pad connected to the second sensing line, and a third pad connected to the third sensing line. The first to third pads are disposed on one side of a region in which the display panel pads are disposed.

In an exemplary embodiment, the electronic device further includes a plurality of display panel pads connected to the display panel unit, a first pad connected to the first sensing line, a second pad connected to the second sensing line, and a third pad connected to the third sensing line. The first pad is spaced apart from at least one of the second pad and the third pad with the display panel pads interposed therebetween.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION

Figure 1A:
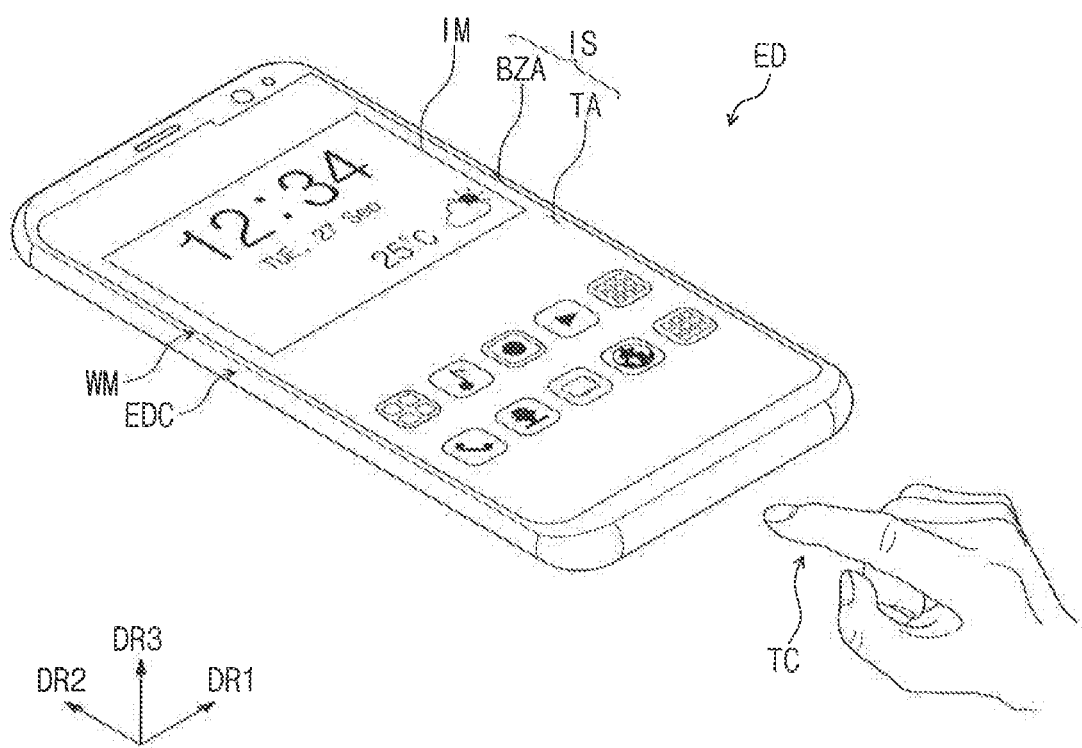
FIG. 1A is a perspective view illustrating an electronic device according to an exemplary embodiment of the inventive concept.

Exemplary embodiments of the inventive concept will be described more fully hereinafter with reference to the accompanying drawings. Like reference numerals may refer to like elements throughout the accompanying drawings.

It will be understood that when an element is referred to as being "connected" or "coupled" to another element, it can be directly connected or coupled to the other element or intervening elements may be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise.

Exemplary embodiments of the inventive concept are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments of the inventive concept should not be construed as limited to the particular shapes of regions illustrated herein but are to include deviations in shapes that result, for example, from manufacturing.

Figure 1B:
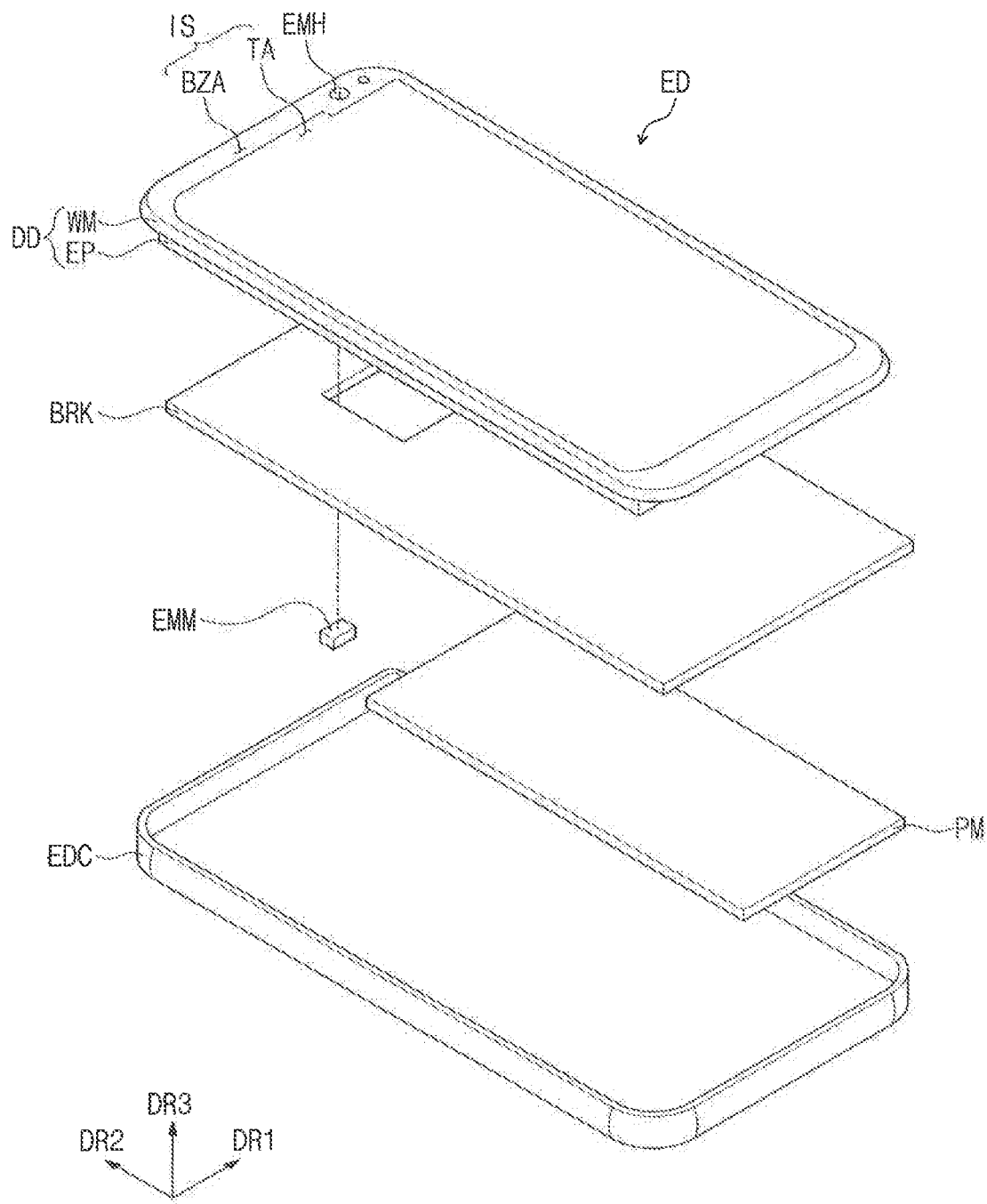
FIG. 1B is an exploded perspective view of the electronic device of FIG. 1A.
Figure 2:
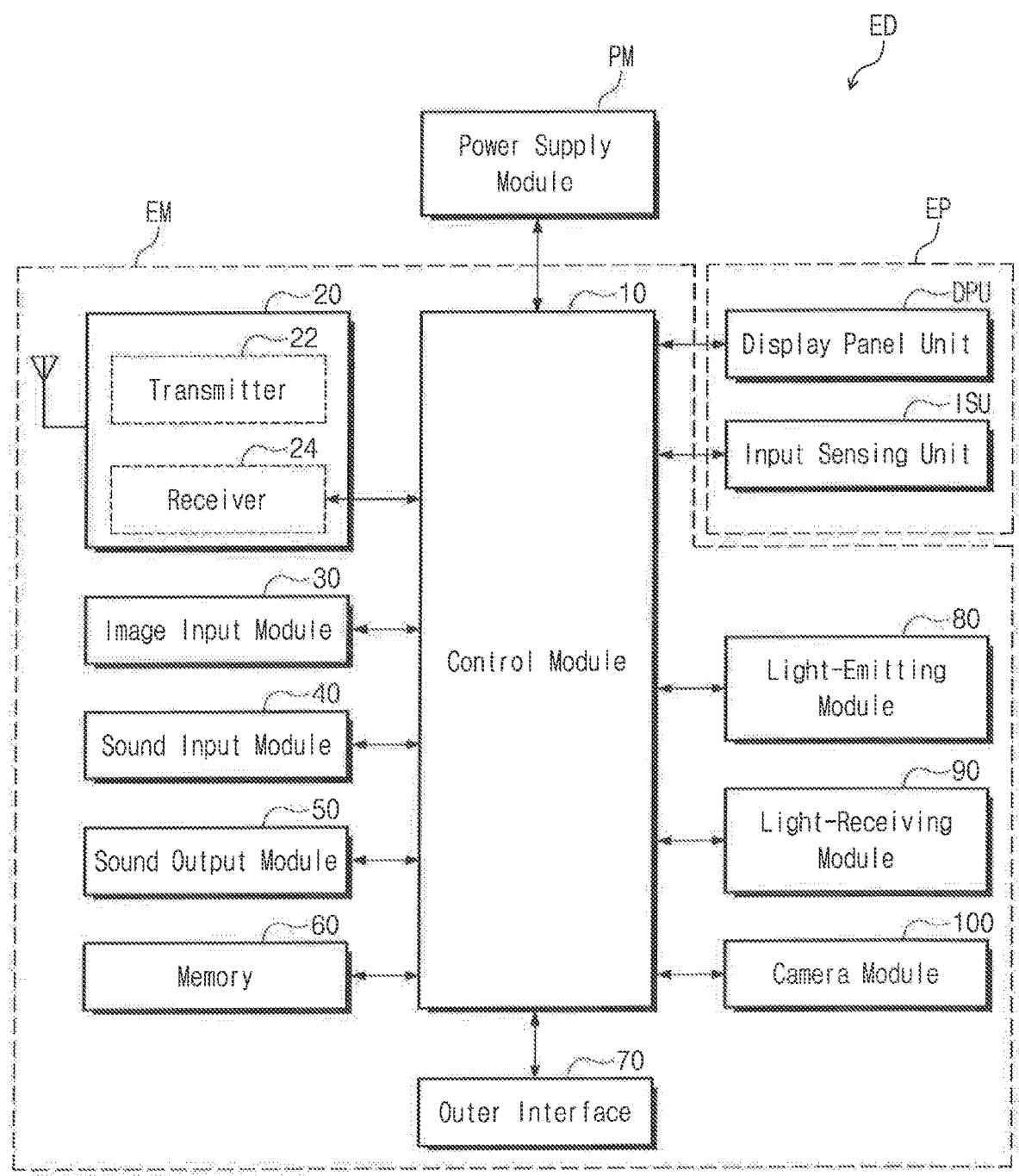
FIG. 2 is a block diagram of the electronic device of FIG. 1A.

FIG. 1A is a perspective view illustrating an electronic device according to an exemplary embodiment of the inventive concept. FIG. 1B is an exploded perspective view of the electronic device of FIG. 1A. FIG. 2 is a block diagram of the electronic device of FIG. 1A.

Hereinafter, an exemplary embodiment of the inventive concept will be described with reference to FIGS. 1A, 1B, and 2.

An electronic device ED may be selectively activated by an electrical signal applied thereto. Various electronic devices may be used as the electronic device ED. For example, the electronic device ED may be one of tablets, notebooks, computers, smart televisions, smartphones, etc. In the present exemplary embodiment, the electronic device ED may be a smartphone, as illustrated in FIG. 1A.

The electronic device ED may display an image IM on a display surface IS. The display surface IS, on which the image IM is displayed, may correspond to a front surface of the electronic device ED and may correspond to a front surface IS of a window member WM. Hereinafter, the display or front surface of the electronic device ED and the front surface of the window member WM will be referred to with the same reference number. The image IM may be a video image or a still image.

In the present exemplary embodiment, a front or top surface and a rear or bottom surface of each element may be distinguished based on the display direction of the image IM. The front surface and the rear surface may be opposite to each other in a third direction DR3, and a direction normal to each of the front and rear surfaces may be parallel to the third direction DR3. A distance between the front surface and the rear surface in the third direction DR3 may correspond to a thickness of a display panel in the third direction DR3.

The front surface of the electronic device ED may be divided into a transmission region TA and a bezel region BZA. The front surface of the electronic device ED may be substantially defined by the front surface IS of the window member WM. Hereinafter, the front surface of the electronic device ED and the front surface IS of the window member WM will be referred to with the same reference numeral IS.

The transmission region TA may be a region in which the image IM is displayed. The image IM may be provided to a user through the transmission region TA. In the present exemplary embodiment, the transmission region TA is illustrated to have a rectangular shape with rounded corners. However, the inventive concept is not limited thereto. For example, in an exemplary embodiment, the shape of the transmission region TA may be variously changed.

The bezel region BZA may be disposed adjacent to the transmission region TA. The bezel region BZA may have a predetermined color. The bezel region BZA may enclose the transmission region TA. Accordingly, a shape of the transmission region TA may be substantially defined by the bezel region BZA. However, the inventive concept is not limited thereto. For example, in an exemplary embodiment, the bezel region BZA may be disposed adjacent to one of side regions of the transmission region TA or may be omitted. The inventive concept is not limited to a specific structure of the electronic device ED, and the structure of the electronic device ED may be variously changed.

In the present exemplary embodiment, the bezel region BZA may include at least one portion protruding toward the transmission region TA compared to a neighboring portion. Accordingly, the transmission region TA may include a relatively recessed portion compared to a neighboring portion.

A module hole EMH may be disposed in the protruding portion of the bezel region BZA. The module hole EMH may be an optically transparent region, similar to the transmission region TA. In the present exemplary embodiment, two module holes, which are spaced apart from each other, are exemplarily illustrated. However, the inventive concept is not limited thereto. In the electronic device ED, the module hole EMH may be used to sense external light or heat, or to obtain an image of a subject. The module hole EMH may be overlapped with at least one of the elements included in the electronic module EM to be described below.

The electronic device ED may sense a user's input TC provided from the outside. The user's input TC may include various types of external inputs, such as a part of a user's body, light, heat, or pressure. In the present exemplary embodiment, the user's input TC may be input to the front surface IS through a user's hand, as shown in FIG. 1A. However, the inventive concept is not limited thereto. For example, in an exemplary embodiment, as described above, the user's input TC may be provided in various forms. Furthermore, depending on the structure of the electronic device ED, the electronic device ED may sense the user's input TC, which is applied through a side or rear surface of the electronic device ED. For example, in an exemplary embodiment, the user may apply the input TC through a side or the rear surface of the electronic device ED instead of through the front surface IS.

The electronic device ED may activate the display surface IS to activate the image IM and sense an external input TC. In the present exemplary embodiment, a region for sensing the external input TC is illustrated as being provided in the transmission region TA displaying the image IM. However, the inventive concept is not limited thereto. For example, in an exemplary embodiment, the region for sensing the external input TC may be provided in the bezel region BZA or in all regions of the display surface IS.

Referring to FIGS. 1B and 2, the electronic device ED may include a display device DD, an electronic module EMM, a power supply module PM, a bracket BRK, and an outer case EDC. The electronic module EMM may also be referred to as an electronic component. In FIGS. 1A and 1B, for convenience of illustration, the elements of the electronic device ED are illustrated in a simplified manner.

The display device DD may include the window member WM and an electronic panel EP. As shown in FIG. 1A, the window member WM may constitute the exterior of the electronic device ED. The window member WM may be an element which protects internal elements of the electronic device ED from an external impact, and substantially serves as the display surface IS of the electronic device ED.

The electronic panel EP may be disposed on a rear surface of the window member WM. The electronic panel EP may display the image IM and sense the external input TC. The electronic panel EP may include a display panel unit DPU and an input sensing unit ISU. The display panel unit DPU may also be referred to as a display panel circuit or a display panel. The input sensing unit ISU may also be referred to as an input sensing component, an input sensor, or an input sensing circuit. The display panel unit DPU may be an element generating the image IM. The image IM generated by the display panel unit DPU may be displayed on the display surface IS through the transmission region TA and may be recognized by a user.

The input sensing unit ISU may sense an external input TC applied from an outside of the electronic device ED. As described above, the input sensing unit ISU may sense the external input TC provided to the window member WM.

The outer case EDC may be coupled to the window member WM. The outer case EDC may define an exterior of the electronic device ED. The outer case EDC may be coupled to the window member WM to define an internal space.

The outer case EDC may be formed of or include a material having a relatively high hardness. For example, the outer case EDC may include a plurality of frames and/or plates, each of which is formed of at least one of glass, plastic, or metallic materials. The outer case EDC may protect elements constituting the electronic device ED, which are contained in the internal space, from an external impact. Several elements constituting the electronic device ED may be contained in the internal space of the outer case EDC.

The bracket BRK may be combined with the display device DD and/or the outer case EDC to divide the internal space of the electronic device ED into at least two spaces. The bracket BRK may provide a space for containing other components. In addition, the bracket BRK may support and fasten the display device DD such that the display device DD is prevented from vibrating. The bracket BRK may have a connection hole, which is formed to have a shape corresponding to that of the electronic module EM and is used to fasten the electronic module EMM. The bracket BRK may include a metallic or plastic member. Although the electronic device ED is illustrated as having just one bracket BRK, the inventive concept is not limited thereto. For example, in an exemplary embodiment, the electronic device ED may include a plurality of brackets BRK.

The power supply module PM may supply an electric power to the electronic device ED. The power supply module PM may include a battery module.

The electronic module EM may include a motherboard and various functional modules, which are mounted on the motherboard and are used to operate the electronic device ED. The motherboard may be electrically connected to the display device DD through a connector. Here, the motherboard may include a rigid-type printed circuit board.

The electronic module EM may be directly mounted on a motherboard electrically connected to the electronic panel EP. In an exemplary embodiment, the electronic module EM may be mounted on a separate substrate and may be electrically connected to a motherboard through a connector. Here, the motherboard may include a rigid-type printed circuit board.

The electronic module EM may include a control module 10 (also referred to as a control circuit), a wireless communication module 20 (e.g., a wireless transceiver), an image input module 30, a sound input module 40 (e.g., a microphone), a sound output module 50 (e.g., a speaker), a memory 60, an outer interface 70, a light-emitting module 80, a light-receiving module 90, and a camera module 100. Herein, the terms module and component may be used interchangeably, and each module/component may be implemented using an electronic circuit. In an exemplary embodiment, at least one of the modules is not mounted on the motherboard and is electrically connected to the motherboard through a flexible circuit board. The electronic module EMM disclosed in FIG. 1B may be at least one of the wireless communication module 20, the image input module 30, the sound input module 40, the sound output module 50, the light-emitting module 80, the light-receiving module 90, and the camera module 100.

The control module 10 may control overall operations of the electronic device ED. The control module 10 may be, for example, a microprocessor. In an exemplary embodiment, the display device DD may be activated or deactivated under the control of the control module 10. The control module 10 may control the image input module 30, the sound input module 40, and the sound output module 50, based on a touch signal received from the display device DD.

The wireless communication module 20 may transmit and receive a wireless signal to and from another terminal via, for example, BLUETOOTH or Wi-Fi. The wireless communication module 20 may transmit and receive a voice signal via a communication line. The wireless communication module 20 may include a transmitter 22 configured to modulate and transmit a signal to be transmitted, and a receiver 24 configured to demodulate a signal to be received.

The image input module 30 may process an image signal and convert it into image data that can be displayed on the display device DD. The sound input module 40 may receive an external sound signal, which is obtained by a microphone in a recording mode, a voice recognition mode, etc., and then convert the received sound signal into electrical voice data. The sound output module 50 may convert sound data, which is received from the wireless communication module 20 or is stored in the memory 60, and output the converted sound data to the outside.

The outer interface 70 may serve as an interface that is connected to an external charger, a wired/wireless data port, a card socket (e.g., a memory card or a SIM/UIM card), etc.

The light-emitting module 80 may generate and output light. The light-emitting module 80 may emit infrared light. The light-emitting module 80 may include a light-emitting diode (LED) device. The light-receiving module 90 may sense the infrared light. The light-receiving module 90 may be activated when the infrared light incident thereto has an intensity higher than a reference value. The light-receiving module 90 may include a CMOS sensor. The infrared light emitted from the light-emitting module 80 may be reflected by an external object (e.g., a user's finger or face) and may be received by the light-receiving module 90. The camera module 100 may be used to obtain an image of an external object.

The electronic module EM may receive an external input transmitted through the module hole EMH or may provide an output through the module hole EMH. The electronic module EM may be at least one of the elements shown in FIG. 2. For example, the electronic module EM may be a camera, a speaker, or a light or heat sensing sensor. The electronic module EM may sense a signal on an external subject, which is received through the module hole EMH, and provide a sound signal (e.g., voice) to the outside through the module hole EMH. However, the inventive concept is not limited thereto. For example, in an exemplary embodiment, the electronic module EM may include at least one of the modules shown in FIG. 2.

The electronic device ED according to an exemplary embodiment of the inventive concept may further include a transparent member disposed between the electronic module EM and the electronic panel EP. The transparent member may be an optically transparent film, which allows an external input transferred through the module hole EMH to pass through the transparent member and to be transferred to the electronic module EM. The transparent member may be attached to a rear surface of the electronic panel EP or may be disposed between the electronic panel EP and the electronic module EM without an additional adhesion layer. The structure of the electronic device ED according to an exemplary embodiment of the inventive concept may be variously changed, and the inventive concept is not limited to a specific structure of the electronic device ED.

Figure 3:
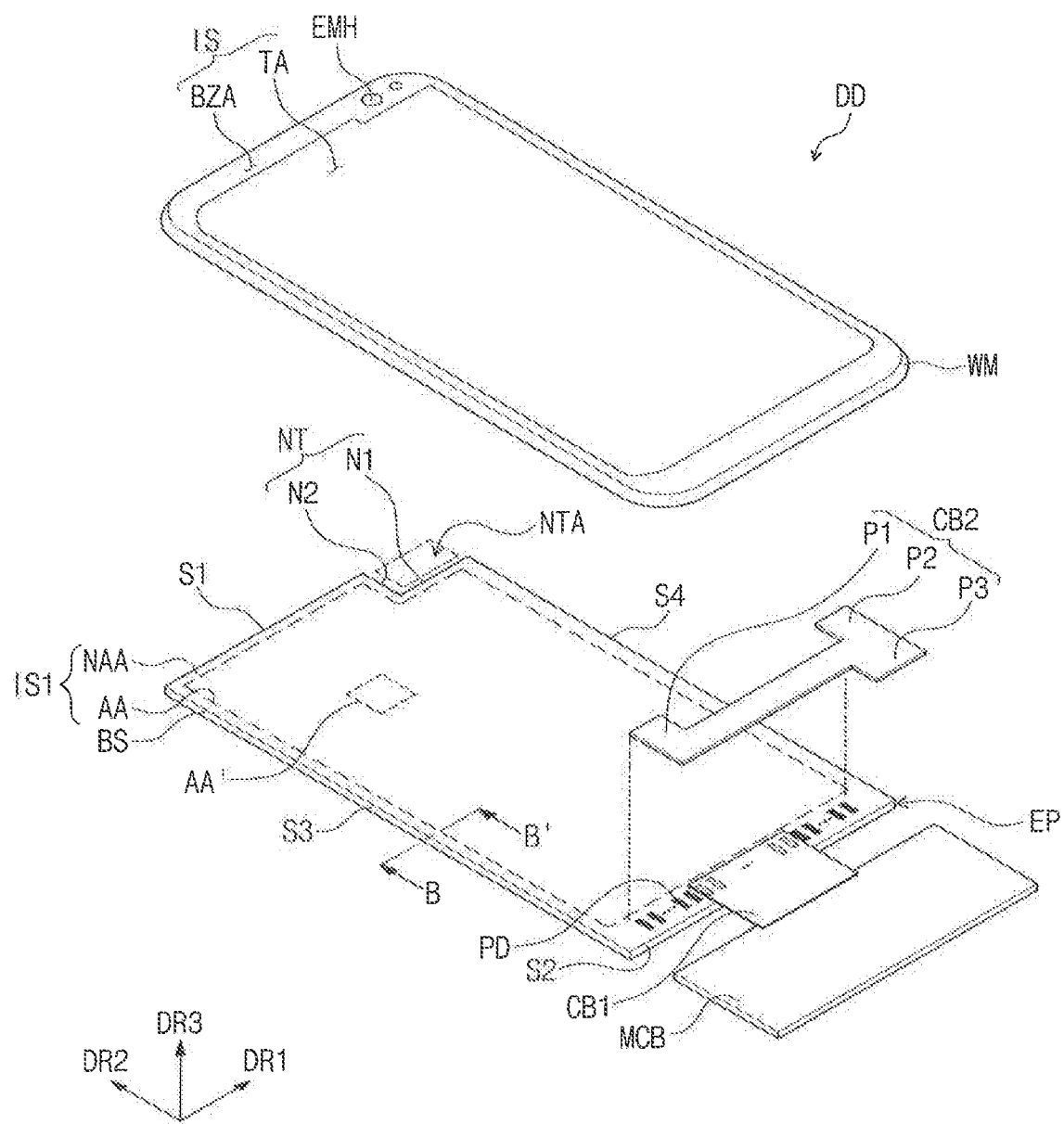
FIG. 3 is an exploded perspective view illustrating some elements shown in FIG. 2A.

FIG. 3 is an exploded perspective view illustrating some elements shown in FIG. 2A. For example, FIG. 3 is an exploded perspective view illustrating the display device DD.

Hereinafter, the display device DD according to an exemplary embodiment of the inventive concept will be described with reference to FIG. 3. For convenience of explanation, elements previously described with reference to FIGS. 1A, 1B, and 2 may be identified by the same reference numerals, and a further description thereof may be omitted.

The display device DD may include a main circuit board MCB, a first circuit board CB1, and a second circuit board CB2, in addition to the window member WM and the electronic panel EP described above.

As described above, the window member WM may include a front surface including the transmission region TA, which is optically transparent, and the bezel region BZA, which is adjacent to the transmission region TA. The window member WM may correspond to the window member WM shown in FIG. 2A, and thus, a further detailed description thereof will be omitted.

The electronic panel EP may provide a front surface IS1 including an active region AA and a peripheral region NAA. The electronic panel EP may activate the active region AA according to an electrical signal. The electronic panel EP may include the active region AA and the peripheral region NAA, which are separated from each other when viewed in a plan view. The active region AA may be a region that is activated according to an electrical signal. The transmission region TA may be overlapped with at least the entire area of the active region AA.

In the present exemplary embodiment, the active region AA may be a region used to display the image IM (e.g., see FIG. 1A) and to sense the external input TC (e.g., see FIG. 1A). However, the inventive concept is not limited thereto. For example, in an exemplary embodiment, the active region AA may be divided into a region for displaying the image IM and another region for sensing the external input TC.

The peripheral region NAA may be a region covered with the bezel region BZA. The peripheral region NAA may be adjacent to the active region AA. The peripheral region NAA may enclose the active region AA. A driving circuit, a driving line, or a pad for driving the active region AA may be disposed in the peripheral region NAA.

In the present exemplary embodiment, a plurality of pads PD are disposed in the peripheral region NAA. The pads PD may be arranged to be spaced apart from each other in the first direction DR1. In the present exemplary embodiment, the pads PD may include a plurality of display panel pads and a plurality of input sensing pads.

The display panel pads may be coupled to the first circuit board CB1. In the present exemplary embodiment, the display panel pads are covered with the first circuit board CB1 and are illustrated by shaded patterns for convenience of illustration.

In an exemplary embodiment, the input sensing pads are not covered by the first circuit board CB1 and may be coupled to the second circuit board CB2. The input sensing pads may be arranged in two separate regions, and pads coupled to the first circuit board CB1 may be disposed between the two separate regions.

The first circuit board CB1 and the second circuit board CB2 may be coupled to the pads PD and may be electrically connected to the electronic panel EP. The first circuit board CB1 and the second circuit board CB2 may be connected to the pads PD that are different from each other.

The first circuit board CB1 may be connected to the display panel pads. The first circuit board CB1 may be a flexible circuit board. The first circuit board CB1 may be electrically connected to the display panel unit DPU (e.g., see FIG. 2) of the electronic panel EP through the display panel pads.

The second circuit board CB2 may be connected to the input sensing pads. The second circuit board CB2 may be a flexible circuit board. The second circuit board CB2 may be electrically connected to the input sensing unit ISU (e.g., see FIG. 2) of the electronic panel EP through the input sensing pads.

The second circuit board CB2 may include first to third circuit portions P1, P2, and P3. The first circuit portion P1 and the second circuit portion P2 may be spaced apart from each other in the first direction DR1 and may be connected to input sensing pads TPD1 and TPD2, respectively, which are arranged in two divided regions. Since the second circuit board CB2 includes the circuit portions P1 and P2 spaced apart from each other, the second circuit board CB2 may be efficiently coupled to each of the input sensing pads arranged in the two divided regions.

The third circuit portion P3 may be extended in a direction opposite to the extension directions of the first and second circuit portions P1 and P2. The third circuit portion P3 may be coupled to the main circuit board MCB. A connector, which is connected to the main circuit board MCB, may be further disposed in the third circuit portion P3. Since the second circuit board CB2 includes the third circuit portion P3, the second circuit board CB2 may be efficiently coupled to the main circuit board MCB.

The main circuit board MCB may include various driving circuits for driving the electronic panel EP or a connector for supplying electric power. Each of the first circuit board CB1 and the second circuit board CB2 may be coupled to the main circuit board MCB. In an exemplary embodiment, the electronic panel EP may be efficiently controlled through one main circuit board MCB. However, the inventive concept is not limited thereto. For example, in the electronic panel EP according to an exemplary embodiment of the inventive concept, the input sensing unit ISU and the display panel unit DPU may be connected to different main circuit boards, respectively, or one of the first circuit board CB1 and the second circuit board CB2 is not connected to the main circuit board MCB.

In the present exemplary embodiment, the electronic panel EP may be assembled in such a way that the active region AA and the peripheral region NAA face the window member WM and are in a flat state. However, the inventive concept is not limited thereto. For example, in an exemplary embodiment, the peripheral region NAA of the electronic panel EP may be partially curved. Here, a portion of the peripheral region NAA may face a rear surface of the electronic device ED, and an area of the bezel region BZA in the front surface of the electronic device ED may be reduced. In an exemplary embodiment, the electronic panel EP may be assembled in such a way that a portion of the active region AA is in a curved state. In an exemplary embodiment, the peripheral region NAA may be omitted from the electronic panel EP.

The electronic panel EP may be configured in such a way that the active region AA has a non-regular shape in a plan view. The shape of the active region AA may be a planar shape of the electronic panel EP and may be variously designed depending on the arrangement or disposition of the elements constituting the electronic panel EP.

For example, in an edge region of the electronic panel EP, a notch portion NT may be defined to have a recessed shape, compared to other edge regions. Accordingly, the active region AA may be defined to have an at least partially recessed shape.

In FIG. 3, the notch portion NT is illustrated as being defined in a right top region of the electronic panel EP. For example, in the present exemplary embodiment, the electronic panel EP may have a polygonal shape that is defined by a first side S1, a second side S2, a third side S3, a fourth side S4, and a plurality of edges defining the notch portion NT.

The first side S1 may extend in the first direction DR1. The second side S2 may be an edge that is parallel to the first side S1 and is opposite to the first side S1. The second side S2 may be longer than the first side S1, when measured in the first direction DR1.

The third side S3 may extend in the second direction DR2 and may connect an end of the first side S1 to an end of the second side S2. The fourth side S4 may be parallel to the third side S3 and may connect the notch portion NT to an opposite end of the second side S2. The fourth side S4 may be an edge that is opposite to the third side S3. The fourth side S4 may be shorter than the third side S3, when measured in the second direction DR2.

The notch portion NT may connect an opposite end of the first side S1 to the fourth side S4. The notch portion NT may include a first notch side N1 and a second notch side N2, which are connected to each other.

The first notch side N1 may extend in the first direction DR1 and may be connected to the fourth side S4. The first notch side N1 may be parallel to the first side S1 and the second side S2 and may be opposite to a portion of the second side S2.

The second notch side N2 may extend in the second direction DR2 and may be connected to the opposite end of the first side S1. The second notch side N2 may be parallel to the third side S3 and the fourth side S4 and may be opposite to a portion of the third side S3.

The notch portion NT may be a portion that is defined by partially removing a rectangular panel including the second side S2 and the third side S3. Accordingly, the first notch side N1 may have a length that is substantially equal to a difference in length between the first side S1 and the second side S2. In addition, the second notch side N2 may have a length that is substantially equal to a difference in length between the third side S3 and the fourth side S4.

A region adjacent to the notch portion NT may be referred to as a notch region NTA. The notch region NTA may have a rectangular or tetragonal shape, whose length (e.g., in the first direction DR1) is substantially equal to that of the first notch side N1 and whose width (e.g., in the second direction DR2) is substantially equal to that of the second notch side N2. The notch region NTA defined by the notch portion NT may be a region overlapped with the module hole EMH and the electronic module EM (e.g., see FIG. 2) when viewed in a plan view.

Since the electronic module EM is disposed to be overlapped with the notch region NTA, electrical interference between the electronic module EM and elements (e.g., signal lines or pixels) of the electronic panel EP may be prevented or reduced. For example, in an exemplary embodiment, in a case in which the electronic module EM is a camera module, the electronic module EM may be disposed in the notch region NTA and is not overlapped with the elements of the electronic panel EP when viewed in a plan view. Accordingly, an image of a subject may be efficiently obtained without any increase in area of the bezel region BZA.

Figure 4A:
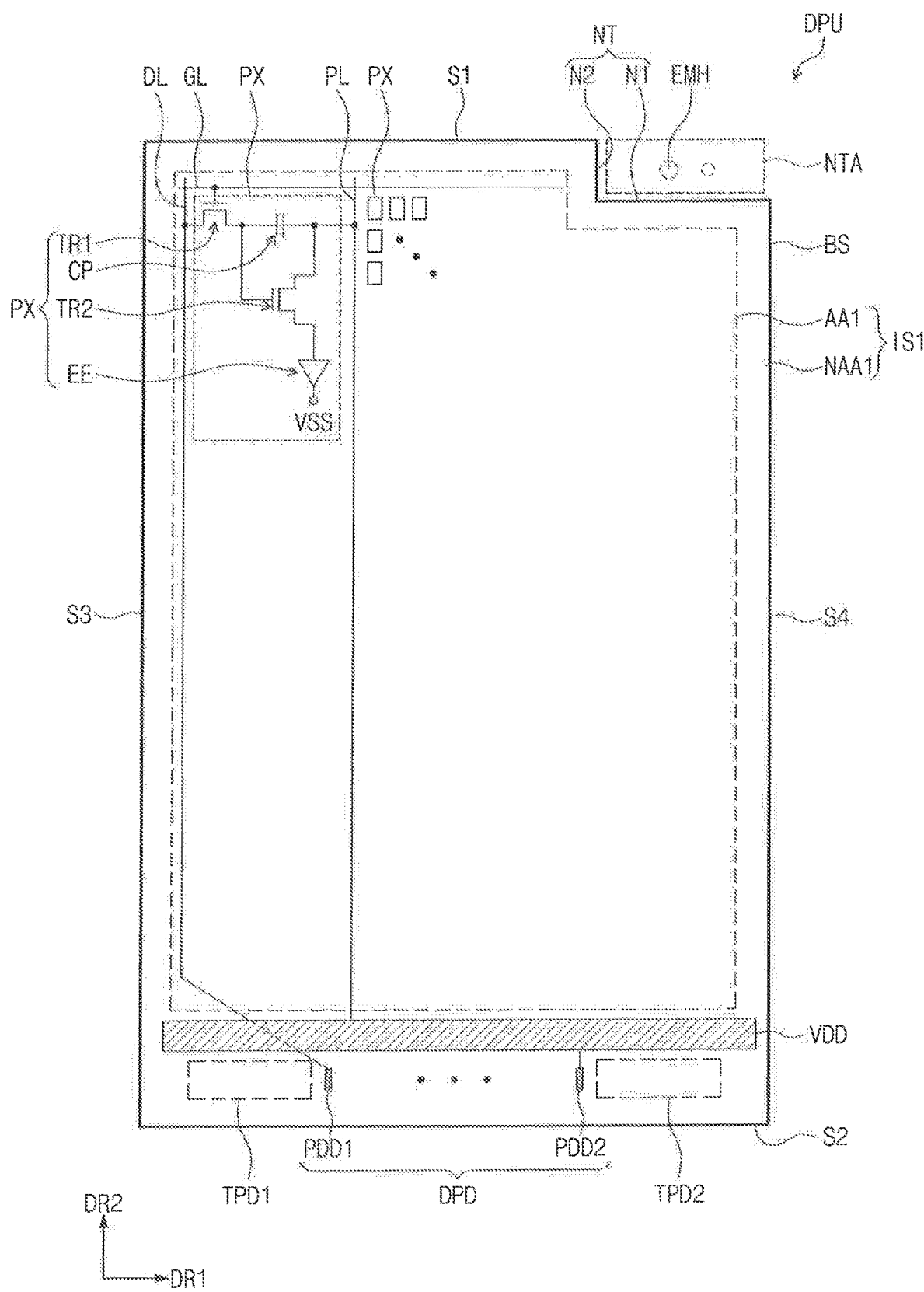
FIGS. 4A and 4B are plan views illustrating some elements constituting an electronic panel according to an embodiment of the inventive concept.
Figure 4B:
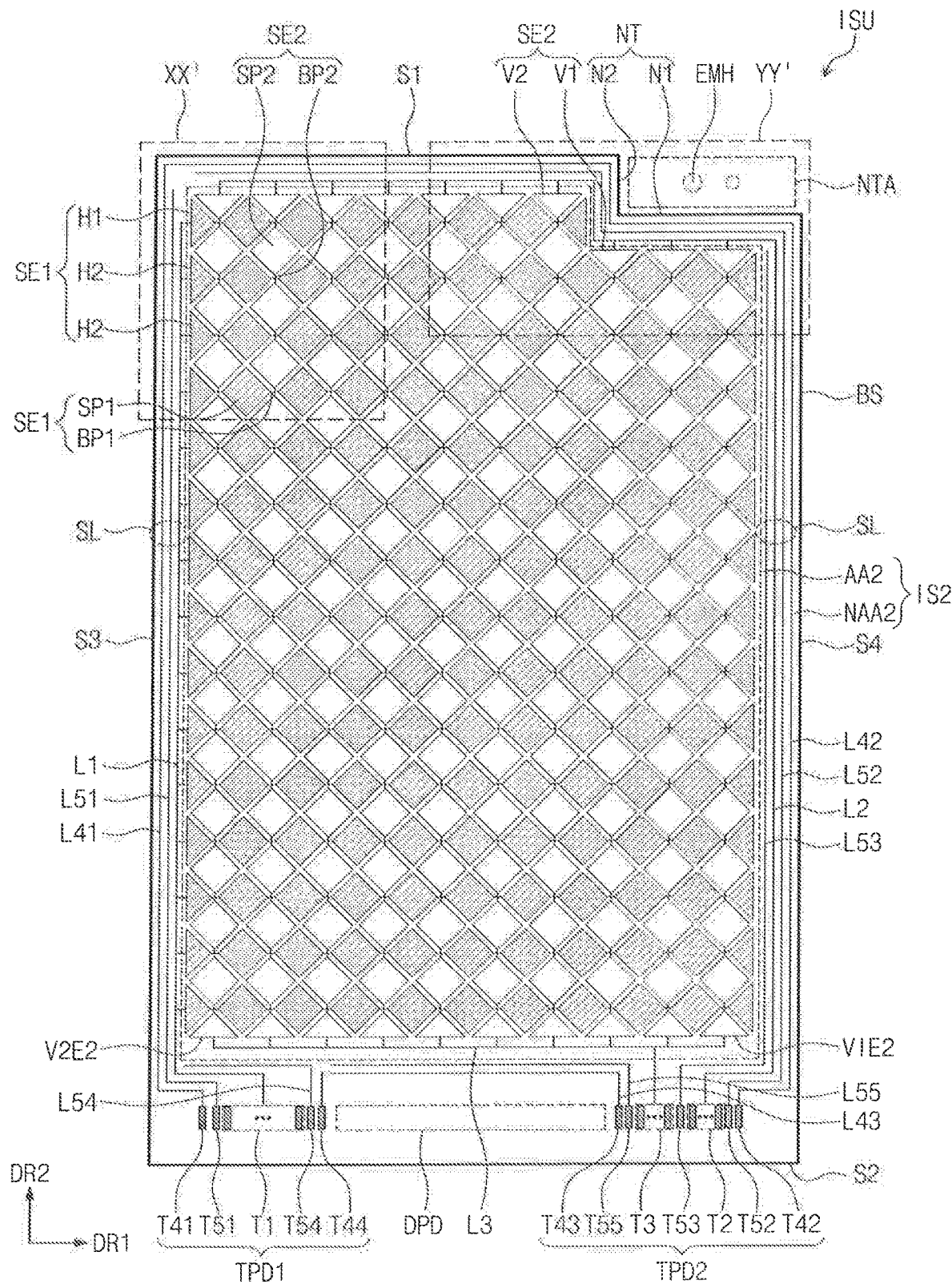
Figure 5A:
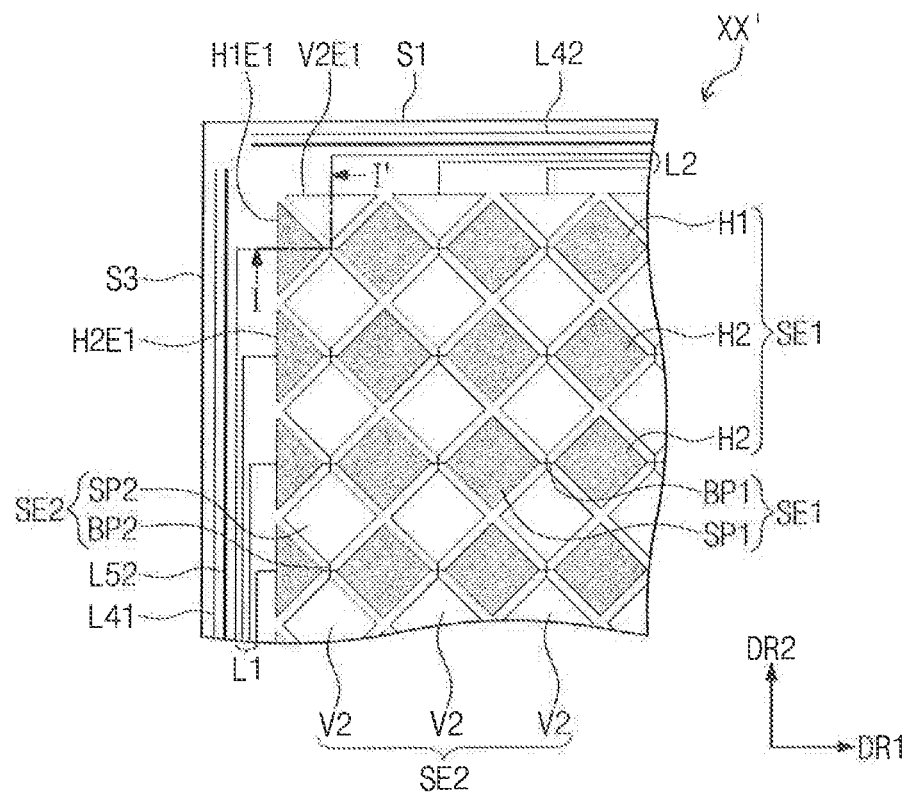
FIGS. 5A and 5B are enlarged plan views, each of which illustrates a region of an electronic panel.
Figure 5B:
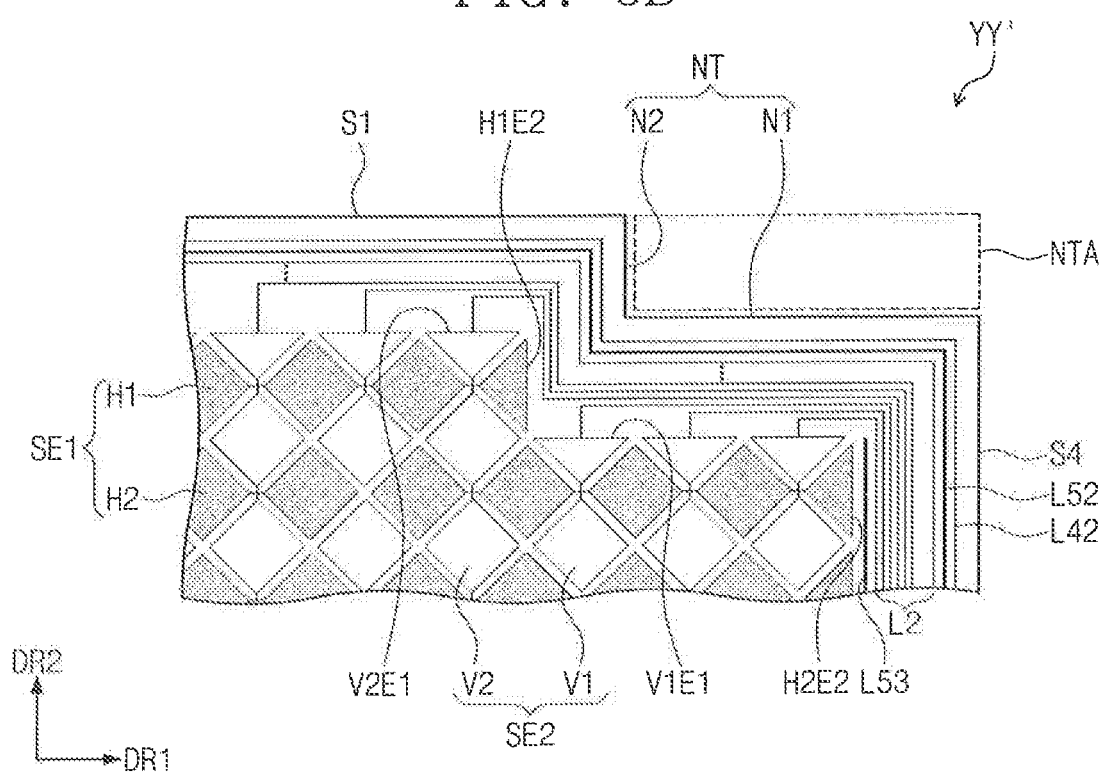

FIGS. 4A and 4B are plan views illustrating some elements constituting an electronic panel according to an exemplary embodiment of the inventive concept. FIGS. 5A and 5B are enlarged plan views, each of which illustrates a region of an electronic panel. FIG. 4A is a plan view illustrating the display panel unit DPU, and FIG. 4B is a plan view illustrating the input sensing unit ISU. FIG. 5A illustrates region 'XX' of FIG. 4B, and FIG. 5B illustrates region 'YY' of FIG. 4B.

Hereinafter, an exemplary embodiment of the inventive concept will be described with reference to FIGS. 4A to 5B. For convenience of explanation, elements previously described with reference to FIGS. 1A to 3 may be identified by the same reference numerals, and a further description thereof may be omitted.

As shown in FIG. 4A, the display panel unit DPU may include a plurality of signal lines GL, DL, and PL, a plurality of pixels PX, a power pattern VDD, and a plurality of display panel pads DPD. Elements constituting the display panel unit DPU may be disposed on a base substrate BS. For convenience of illustration, a circuit structure of one pixel PX and the signal lines GL, DL, and PL connected to the pixel PX are schematically illustrated in FIG. 4A.

The base substrate BS may provide a front surface IS1 including a first region AA1 and a second region NAA1. The first region AA1 may be a region in which the pixels PX are disposed, and may have a shape defined by the edges (e.g., S1, S2, S3, and S4) of the electronic panel and the notch portion NT. Accordingly, in an exemplary embodiment, the pixels PX are not disposed in the notch region NTA. The first region AA1 may correspond to the active region AA (e.g., see FIG. 3), and the second region NAA1 may correspond to the peripheral region NAA (e.g., see FIG. 3).

The signal lines GL, DL, and PL may include a scan line GL, a data line DL, and a power line PL. The scan line GL may be used to transmit a scan signal to the pixel PX. An on/off operation of the pixel PX may be controlled by the scan signal. The data line DL may be used to transmit a data signal to the pixel PX. The pixel PX may display light in response to the data signal. The power line PL may be used to transmit a power signal (hereinafter, a first power signal) to the pixel PX. However, the inventive concept is not limited thereto. For example, in an exemplary embodiment, the pixel PX may be further connected to other signal lines.

In an exemplary embodiment, a plurality of the pixels PX may be arranged in the first region AA1. A circuit structure of one of the plurality of the pixels PX is exemplarily illustrated in FIG. 4A. The pixel PX may include a first thin film transistor TR1, a capacitor CP, a second thin film transistor TR2, and a light-emitting element EE. The first thin film transistor TR1 may be a switching device configured to control the on/off operation of the pixel PX. The first thin film transistor TR1 may transmit or block a data signal transmitted through the data line DL in response to a scan signal to be transmitted through the scan line GL.

The capacitor CP may be connected to the first thin film transistor TR1 and the power line PL. The capacitor CP may be used to store electric charges, and an amount of the electric charges stored in the capacitor CP may be determined by a voltage difference between the data signal transmitted from the first thin film transistor TR1 and the first power signal applied to the power line PL.

The second thin film transistor TR2 may be connected to the first thin film transistor TR1, the capacitor CP, and the light-emitting element EE. The second thin film transistor TR2 may control a driving current flowing through the light-emitting element EE in accordance with an amount of charges stored in the capacitor CP. A turn-on time of the second thin film transistor TR2 may be determined depending on the amount of charges stored in the capacitor CP. During the turn-on time, the second thin film transistor TR2 may provide the first power signal, which is transferred through the power line PL, to the light-emitting element EE.

The light-emitting element EE may generate light or control an amount of light according to an electrical signal. The light-emitting element EE may include, for example, an organic light emitting element, a quantum dot light emitting element, an electrophoretic element, or an electrowetting element.

The light-emitting element EE may be connected to a power terminal VSS to receive a power signal (hereinafter, a second power signal) which is different from the first power signal provided through the power line PL. A difference in voltage between the electrical signal provided from the second thin film transistor TR2 and the second power signal may determine an amount of the driving current flowing through the light-emitting element EE, and in this case, an intensity of the light generated by the light-emitting element EE may be determined by the amount of the driving current. However, the inventive concept is not limited thereto. For example, in an exemplary embodiment, various electronic elements may be arranged in the pixel PX.

The power pattern VDD may be disposed in the peripheral region NAA. In the present exemplary embodiment, the power pattern VDD may be coupled to a plurality of power lines PL. Accordingly, the same power signal (e.g., the first power signal) may be provided to a plurality of pixels PX.

The display panel pads DPD may be disposed in the peripheral region NAA. As described above, the second circuit board CB2 (e.g., see FIG. 3) may be electrically connected to the display panel unit DPU through the display panel pads DPD. The display panel pads DPD may be connected to one of the signal lines connected to the pixel PX. For example, the display panel pads DPD may include a pad PDD1 connected to the data line DL and a pad PDD2 connected to the power pattern VDD. However, the inventive concept is not limited thereto. For example, in an exemplary embodiment, the display panel pads DPD may further include a pad connected to the scan line GL or pads connected to other signal lines.

Referring to FIG. 4B, the input sensing unit ISU may be disposed on the base substrate BS. The input sensing unit ISU may be disposed on the display panel unit DPU or between the display panel unit DPU and the base substrate BS, or may be spaced apart from the display panel unit DPU with the base substrate BS interposed therebetween.

The input sensing unit ISU may include a plurality of first sensing electrodes SE1, a plurality of second sensing electrodes SE2, a plurality of lines L1, L2, L3, L41, L42, L51, L52, and L53, and a plurality of input sensing pads TPD1 and TPD2. The input sensing pads TPD1 may include pads T1, T41, T44, T51, and T54. The input sensing pads TPD2 may include pads T2, T3, T42, T43, T52, T53, and T55.

The first sensing electrodes SE1 and the second sensing electrodes SE2 may be disposed in a first region AA2. The first region AA2 may be overlapped with the first region AA1 of the display panel unit DPU and may correspond to the active region AA of the electronic panel EP. The lines L1, L2, L3, L41, L42, L51, L52, and L53 and the input sensing pads TPD1 and TPD2 may be disposed in a second region NAA2. As described above, the input sensing pads TPD1 and TPD2 may include a first sensing pad group (including input sensing pads TPD1) and a second sensing pad group (including input sensing pads TPD2), which are disposed in separate regions. The second region NAA2 may be overlapped with the second region NAA1 of the display panel unit DPU and may correspond to the peripheral region NAA of the electronic panel EP.

Each of the first sensing electrodes SE1 may be extended in the first direction DR1. The first sensing electrodes SE1 may be arranged in the second direction DR2. Each of the first sensing electrodes SE1 may include a plurality of first sensing patterns SP1 and a plurality of first bridge patterns BP1. Each of the first bridge patterns BP1 may connect a pair of the first sensing patterns SP1, which are adjacent to each other in the first direction DR1. For example, a first first sensing electrode SE1 may be arranged above a second first sensing electrode SE1 in the second direction DR2, the second first sensing electrode SE1 may be arranged above a third first sensing electrode SE1 in the second direction DR2, etc.

The first sensing electrodes SE1 may include a plurality of row electrodes H1 and H2, which are extended in the first direction DR1 and are arranged in the second direction DR2. The row electrodes H1 and H2 may include a first row electrode H1 and a second row electrode H2.

The first row electrode H1 may be a sensing electrode, which is one of the first sensing electrodes SE1 and is disposed between the third side S3 and the second notch side N2. For example, the first row electrode H1 may include a plurality of first sensing patterns SP1 connected to one another in the first direction DR1 between the third side S3 and the second notch side N2. One of two opposite ends of the first row electrode H1 may face the notch region NTA. The first row electrode H1 may be overlapped with the notch region NTA when viewed in the first direction DR1. The first line L1 may be spaced apart from the notch region NTA in the first direction DR1 with the first row electrode H1 interposed therebetween.

The second row electrode H2 may be a sensing electrode, which is one of the first sensing electrodes SE1 and is disposed between the third side S3 and the fourth side S4. For example, the second row electrode H2 may include a plurality of first sensing patterns SP1 connected to one another in the first direction DR1 between the third side S3 and the fourth side S4. In an exemplary embodiment, the second row electrode H2 is not overlapped with the notch region NTA when viewed in the first direction DR1.

The first row electrode H1 and the second row electrode H2 may have lengths that are different from each other in the first direction DR1. A length of the first row electrode H1 in the first direction DR1 may be smaller than a length of the second row electrode H2 in the first direction DR1. A difference between lengths of the first row electrode H1 and the second row electrode H2 measured in the first direction DR1 may substantially correspond to a length of the first notch side N1 or a length of the notch region NTA in the first direction DR1.

The first row electrode H1 may include an end H1E1 (hereinafter, a first left end) and an opposite end H1E2 (hereinafter, a first right end) that are opposite to each other in the first direction DR1. The first left end H1E1 may be adjacent to the third side S3, and the first right end H1E2 may be adjacent to the second notch side N2. The first right end H1E2 may face the notch region NTA in the first direction DR1.

The second row electrode H2 may include an end H2E1 (hereinafter, a second left end) and an opposite end H2E2 (hereinafter, a second right end), which are opposite to each other in the first direction DR1. The second left end H2E1 may be adjacent to the third side S3, and the second right end H2E2 may be adjacent to the fourth side S4. In the present exemplary embodiment, the first row electrode H1 is illustrated as being a single sensing electrode. However, the inventive concept is not limited thereto. For example, in an exemplary embodiment, the number of the first row electrode H1 may be increased such that the first row electrodes H1 occupy a region corresponding to a width of the notch region NTA in the second direction DR2 (e.g., a length of the second notch side N2). Each of the second sensing electrodes SE2 may be extended in the second direction DR2. The second sensing electrodes SE2 may be arranged in the first direction DR1. The second sensing electrodes SE2 may be arranged to cross the first sensing electrodes SE1. The second sensing electrodes SE2 may include a plurality of second sensing patterns SP2 and a plurality of the second bridge patterns BP2. Each of the second bridge patterns BP2 may connect a pair of the second sensing patterns SP2, which are adjacent to each other in the second direction DR2. For example, a first second sensing electrode SE2 may be arranged to the left of a second second sensing electrode SE2 in the first direction DR1, the second second sensing electrode SE2 may be arranged to the left of a third second sensing electrode SE2 in the first direction DR1, etc.

The second sensing electrodes SE2 may include a plurality of column electrodes V1 and V2, which are extended in the second direction DR2 and are arranged in the first direction DR1. For example, each of the column electrodes V1 and V2 may include a plurality of second sensing patterns SP2 connected to one another in the second direction DR2. The column electrodes V1 and V2 may include a first column electrode V1 and a second column electrode V2.

The first column electrode V1 may be a sensing electrode, which is one of the second sensing electrodes SE2 and is disposed between the first notch side N1 and the second side S2. One of two opposite ends of the first column electrode V1 may face the notch region NTA. The first column electrode V1 may be overlapped with the notch region NTA when viewed in the second direction DR2.

The second column electrode V2 may be a sensing electrode, which is one of the second sensing electrodes SE2 and is disposed between the first side S1 and the second side S2. In an exemplary embodiment, the second column electrode V2 is not overlapped with the notch region NTA when viewed in the second direction DR2.

The first column electrode V1 and the second column electrode V2 may have lengths that are different from each other in the second direction DR2. A length of the first column electrode V1 in the second direction DR2 may be smaller than a length of the second column electrode V2 in the second direction DR2. A difference between lengths of the first and second column electrodes V1 and V2 measured in the second direction DR2 may substantially correspond to a length of the second notch side N2 or a width of the notch region NTA in the second direction DR2.

The first column electrode V1 may include an end V1E1 (hereinafter, a first upper end) and an opposite end V1E2 (hereinafter, a first lower end) that are opposite to each other in the second direction DR2. The first upper end V1E1 may be adjacent to the first notch side N1, and the first lower end V1E2 may be adjacent to the second side S2. The first upper end V1E1 may face the notch region NTA in the second direction DR2.

The second column electrode V2 may include an end V2E1 (hereinafter, a second upper end) and an opposite end V2E2 (hereinafter, a second lower end) that are opposite to each other in the second direction DR2. The second upper end V2E1 may be adjacent to the first side S1, and the second lower end V2E2 may be adjacent to the second side S2.

The lines L1, L2, L3, L41, L42, L51, L52, and L53 may connect the first sensing electrodes SE1 and the second sensing electrodes SE2 to the input sensing pads TPD1 and TPD2. The lines L1, L2, L3, L41, L42, L43, L51, L52, and L53 may include a plurality of first lines L1, a plurality of second lines L2, a plurality of third lines L3, a plurality of power lines L41, L42, and L43, and a plurality of guard lines L51, L52, and L53.

The first lines L1 may connect the first sensing electrodes SE1 to first sensing pads T1. The first sensing pads T1 may be disposed in the group of first input sensing pads TPD1. The first lines L1 may be connected to ends of the first sensing electrodes SE1 to transfer an electrical signal to the first sensing electrodes SE1 through the first sensing pads T1. In the present exemplary embodiment, the first left end H1E1 and the second left end H2E1 may be connected to the first lines L1, respectively. Herein, a line may be referred to as a reference line when it provides a voltage different from those of other lines being described relative to the reference line.

The second lines L2 may connect the second sensing electrodes SE2 to second sensing pads T2. The second sensing pad T2 may be disposed in the group of second input sensing pads TPD2. The second lines L2 may be connected to ends of the second sensing electrodes SE2 to transfer an electrical signal to the second sensing electrodes SE2 through the second sensing pads T2. In the present exemplary embodiment, the first upper end V1E1 and the second upper end V2E1 may be connected to the second lines L2, respectively.

In the present exemplary embodiment, the second sensing electrodes SE2 may also be connected to the third lines L3. The third lines L3 may connect the second sensing electrodes SE2 to third sensing pads T3. The third sensing pads T3 may be disposed in the group of second input sensing pads TPD2. The third lines L3 may be connected to opposite ends of the second sensing electrodes SE2 and may transfer an electrical signal to the second sensing electrodes SE2 through the third sensing pads T3. In the present exemplary embodiment, the first lower end V1E2 and the second lower end V2E2 may be connected to the third lines L3, respectively.

In an exemplary embodiment, since the second lines L2 and the third lines L3 are connected to the second sensing electrodes SE2, whose lengths are longer than those of the first sensing electrodes SE1, sensitivity may be prevented from decreasing as a result of an increase in resistance of the first region AA2. Accordingly, the input sensing unit ISU may be configured to provide uniform sensitivity throughout the active region AA.

In the present exemplary embodiment, the first lines L1 connected to the first sensing electrodes SE1 are not overlapped with the second lines L2 and the third lines L3 connected to the second sensing electrodes SE2 when viewed in a plan view. Referring to FIGS. 5A and 5B, only the second lines L2, not the first lines L1, may be disposed in a region adjacent to the notch region NTA. The first sensing electrodes SE1 may be connected to the first lines L1 through the left ends H1E1 and H2E1. The first right end H1E2 and the second right end H2E2 may be adjacent to the first region AA2 but may not be connected to the first lines L1 or any other signal line.

In an exemplary embodiment, in the notch portion NT, the first lines L1 and the second lines L2 may be spaced apart from each other and are not overlapped with each other in a plan view. Accordingly, electrical interference, which may occur when the first lines L1 and the second lines L2 are overlapped with each other, may be prevented or reduced. Furthermore, parasitic capacitance occurring between the first lines L1 and the second lines L2, and noise between the first sensing electrode SE1 and the second sensing electrode SE2, which may occur in a region provided with the notch portion NT, may be prevented or reduced. Accordingly, the sensitivity of the input sensing unit ISU may be improved.

In an exemplary embodiment, the first lines L1 do not pass through the notch portion NT. Although, owing to the notch portion NT, the plurality of the row electrodes H1 and H2 may have at least two different lengths, the first lines L1 may be connected to the row electrodes H1 and H2 in substantially the same shape. Even when the first and second row electrodes H1 and H2 have lengths different from each other, the first lines L1 may be connected to respective side ends, which are aligned in the second direction DR2, of the first and second row electrodes H1 and H2, and thus, a length of a signal line may be prevented from being increased for connection with the first row electrode H1 having a relatively short length. Accordingly, although the electronic panel EP has the notch portion NT, the first sensing electrodes SE1 may be stably connected to the first lines L1.

The power lines L41, L42, and L43 may provide a base voltage to the input sensing unit ISU. In the present exemplary embodiment, the power lines L41, L42, and L43 may provide a ground voltage. The power lines L41, L42, and L43 may include a first power line L41, a second power line L42, and a third power line L43, which are connected to different pads, respectively.

The first power line L41 and the second power line L42 may be disposed along an edge of the base substrate BS. For example, the first power line L41 may be extended along the third side S3 and may be connected to a first power pad T41. The first power pad T41 may be included in the group of first input sensing pads TPD1. The second power line L42 may be connected to a second power pad T42 and may be extended along the first side S1, the second notch side N2, the first notch side N1, and the fourth side S4. The second power pad T42 may be included in the group of second input sensing pads TPD2. The third power line L43 may be disposed near the second side S2, may be extended along the third lines L3, and may be connected to a third power pad T43. The third power pad T43 may be included in the group of second input sensing pads TPD2.

The guard lines L51, L52, and L53 may shield adjacent signal lines from each other. In an exemplary embodiment, parasitic capacitance occurring between adjacent signal lines transferring different signals may be decreased, and thereby, noise may be prevented or reduced.

In the present exemplary embodiment, the guard lines L51, L52, and L53 may include a first guard line L51, a second guard line L52, a third guard line L53, a fourth guard line L54, and a fifth guard line L55, which are connected to different pads.

The first guard line L51 may be disposed between the first power line L41 and the first lines L1. For example, the first guard line L51 may be disposed between the leftmost first line of the first lines L1 (e.g., the first line connected to the first row electrode H1) and the first power line L41. The first guard line L51 may receive a voltage that is different from a voltage provided to each of the first line L1, which is connected to the first row electrode H1, and the first power line L41. Accordingly, electrical interference may be prevented or reduced between the first line L1, which is connected to the first row electrode H1, and the first power line L41.

The second guard line L52 may be disposed between the second power line L42 and the second lines L2. For example, the second guard line L52 may be disposed between the rightmost second line of the second lines L2 (e.g., a second line connected to the leftmost second column electrode of the second column electrodes V2) and the second power line L42. The second guard line L52 may receive a voltage that is different from a voltage provided to each of the second line L2 and the second power line L42. Accordingly, electrical interference may be prevented or reduced between the second line L2 and the second power line L42.

The third guard line L53 may be disposed between the third power line L43 and the third lines L3. For example, the third guard line L53 may be disposed between the lowermost third line of the third lines L3 (e.g., a third line connected to the leftmost second column electrode of the second column electrodes V2) and the third power line L43. The third guard line L53 may receive a voltage that is different from a voltage provided to each of the third line L3 and the third power line L43. Accordingly, electrical interference may be prevented or reduced between the third line L3 and the third power line L43.

The fourth guard line L54 may be disposed between the first lines L1 and the third lines L3. For example, the fourth guard line L54 may be disposed between the rightmost first line of the first lines L1 and the leftmost third line of the third lines L3. The fourth guard line L54 may receive a voltage that is different from voltages provided to the first and third lines adjacent to each other. Accordingly, electrical interference may be prevented or reduced between the adjacent first and third lines L1 and L3.

The fifth guard line L55 may be disposed between the second lines L2 and the sensing electrodes SE1 and SE2. For example, the fifth guard line L55 may be extended along the fourth side S4 and may be disposed between the opposite ends H2E2 of the second row electrodes H2 and the leftmost second line of the second lines L2. The fifth guard line L55 may serve as an electric shielding element between the sensing electrodes SE1 and SE2 and the second line L2, and may prevent or reduce electrical interference between the sensing electrodes SE1 and SE2 and the second line L2.

The input sensing pads may be classified into two groups TPD1 and TPD2 spaced apart from each other in the first direction DR1 by a region, which is depicted by a dotted line in FIG. 4B and is provided with the display panel pads DPD. Since the input sensing pads TPD1 and TPD2 are disposed in two separate regions, exemplary embodiments may prevent lengths and design complexity of the signal lines from being increased.

In an exemplary embodiment, the first to third lines L1, L2, and L3 connected to the sensing electrodes SE1 and SE2 may be disposed to be spaced apart from each other. The first lines L1 may be connected to ends of the first sensing electrodes SE1. The signal lines may be designed to be disconnected from the opposite end H1E2 of the first row electrode H1 adjacent to the notch portion NT.

Accordingly, in exemplary embodiments, the first lines L1 are not overlapped with the second lines L2 and the third lines L3 when viewed in a plan view. Since the first lines L1 are designed to be spaced apart from the second lines L2 and the third lines L3 in a plan view, electrical interference between the signal lines, which may occur in the notch portion NT, may be suppressed, and as a result, noise may be prevented or reduced. Accordingly, although the notch portion NT is provided in the input sensing unit ISU, the input sensing unit ISU may have an improved sensing property.

Figure 6A:
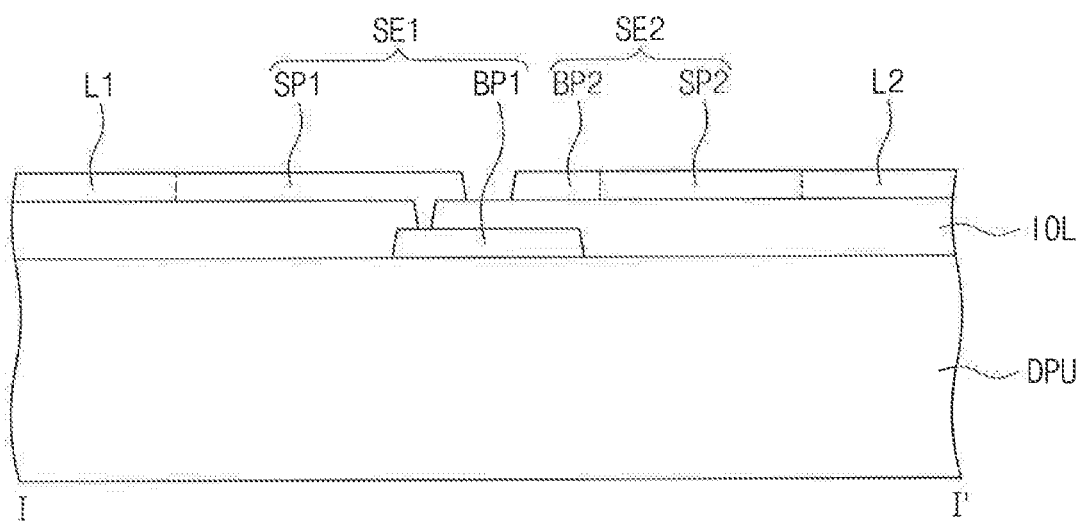
FIGS. 6A and 6B are cross-sectional views, each of which schematically illustrates a region of an electronic panel according to an embodiment of the inventive concept.
Figure 6B:
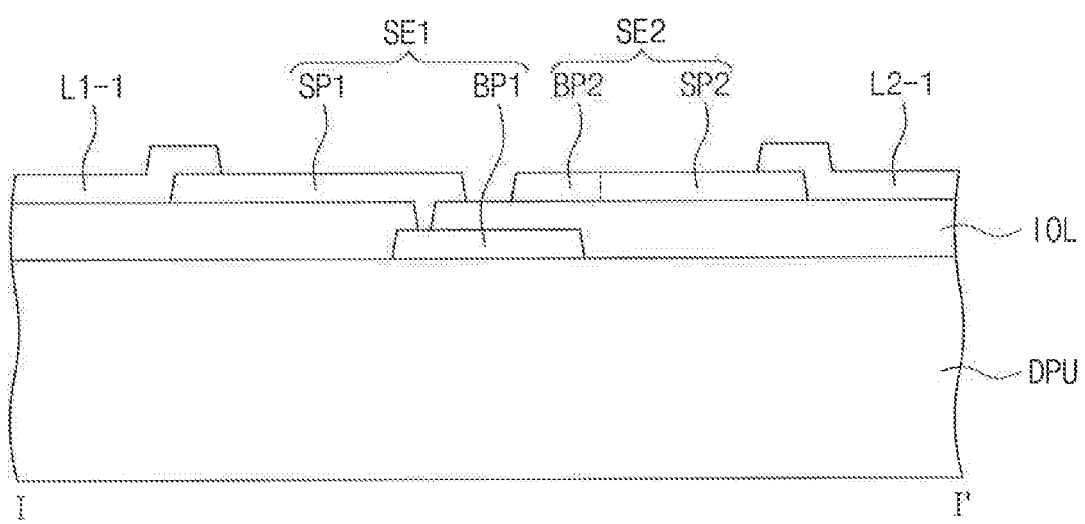

FIGS. 6A and 6B are cross-sectional views, each of which schematically illustrates a region of an electronic panel according to an exemplary embodiment of the inventive concept. For example, each of the cross-sectional views of FIGS. 6A and 6B illustrates a region taken along line I-I' of FIG. 5A. For convenience of illustration and description, the display panel unit DPU is briefly illustrated in FIGS. 6A and 6B.

Hereinafter, the display panel unit DPU according to an exemplary embodiment of the inventive concept will be described with reference to FIGS. 6A and 6B. For convenience of explanation, elements previously described with reference to FIGS. 1A to 5B may be identified by the same reference numerals, and a further description thereof may be omitted.

In the input sensing unit ISU shown in FIG. 6A, the first line L1 and the second line L2 may be disposed on the same layer. The first line L1 and the second line L2 may be disposed on the same layer as a first sensing pattern SP1 and a second sensing pattern SP2, and may be connected to the first sensing pattern SP1 and the second sensing pattern SP2, respectively.

The first line L1 may be disposed on an insulating layer IOL and may be connected to the first sensing pattern SP1. In the present exemplary embodiment, the first line L1 and the first sensing pattern SP1 may have an integral shape. For example, the first line L1 and the first sensing pattern SP1 may be connected to each other to form a single body.

A first bridge pattern BP1 and a second bridge pattern BP2 may be disposed on different layers. In the present exemplary embodiment, the first bridge pattern BP1 may be vertically spaced apart from the second bridge pattern BP2 with the insulating layer IOL interposed therebetween. The first sensing pattern SP1 may penetrate the insulating layer IOL and may be connected to the first bridge pattern BP1. The second bridge pattern BP2 and the second sensing pattern SP2 may be disposed on the same layer.

The second sensing pattern SP2, the second bridge pattern BP2, and the second line L2 may be disposed on the insulating layer IOL and may be connected to each other. The second sensing pattern SP2, the second bridge pattern BP2, and the second line L2 may have an integral shape. For example, the second sensing pattern SP2, the second bridge pattern BP2, and the second line L2 may form a single body. Accordingly, the second sensing electrode SE2 and the second line L2 may be simultaneously formed using one mask, which may simplify a fabrication process and reduce a process cost.

As shown in FIG. 6B, a first line L1-1 and a second line L2-1 may be disposed on the insulating layer IOL, but may be formed by a process different from that for the first sensing pattern SP1 and the second sensing pattern SP2. The first line L1-1 may be disposed on the insulating layer IOL and may cover at least a portion of the first sensing pattern SP1. The first line L1-1 may be in direct contact with the first sensing pattern SP1 and may be connected to the first sensing electrode SE1.

The second line L2-1 may be disposed on the insulating layer IOL and may cover at least a portion of the second sensing pattern SP2. The second line L2-1 may be in direct contact with the second sensing pattern SP2 and may be connected to the second sensing electrode SE2.

According to exemplary embodiments of the inventive concept, the first line L1 or L1-1 and the second line L2 or L2-1 are not overlapped with each other when viewed in a plan view. Accordingly, the first line L1 or L1-1 and the second line L2 or L2-1, which are used to transfer electrical signals different from each other, may be disposed on the same layer. In an exemplary embodiment, since the first line L1 or L1-1 and the second line L2 or L2-1 are disposed on the same layer, the first line L1 or L1-1 and the second line L2 or L2-1 may be simultaneously formed using one mask. As a result, a fabrication process may be simplified and a process cost may be reduced.

Figure 7A:
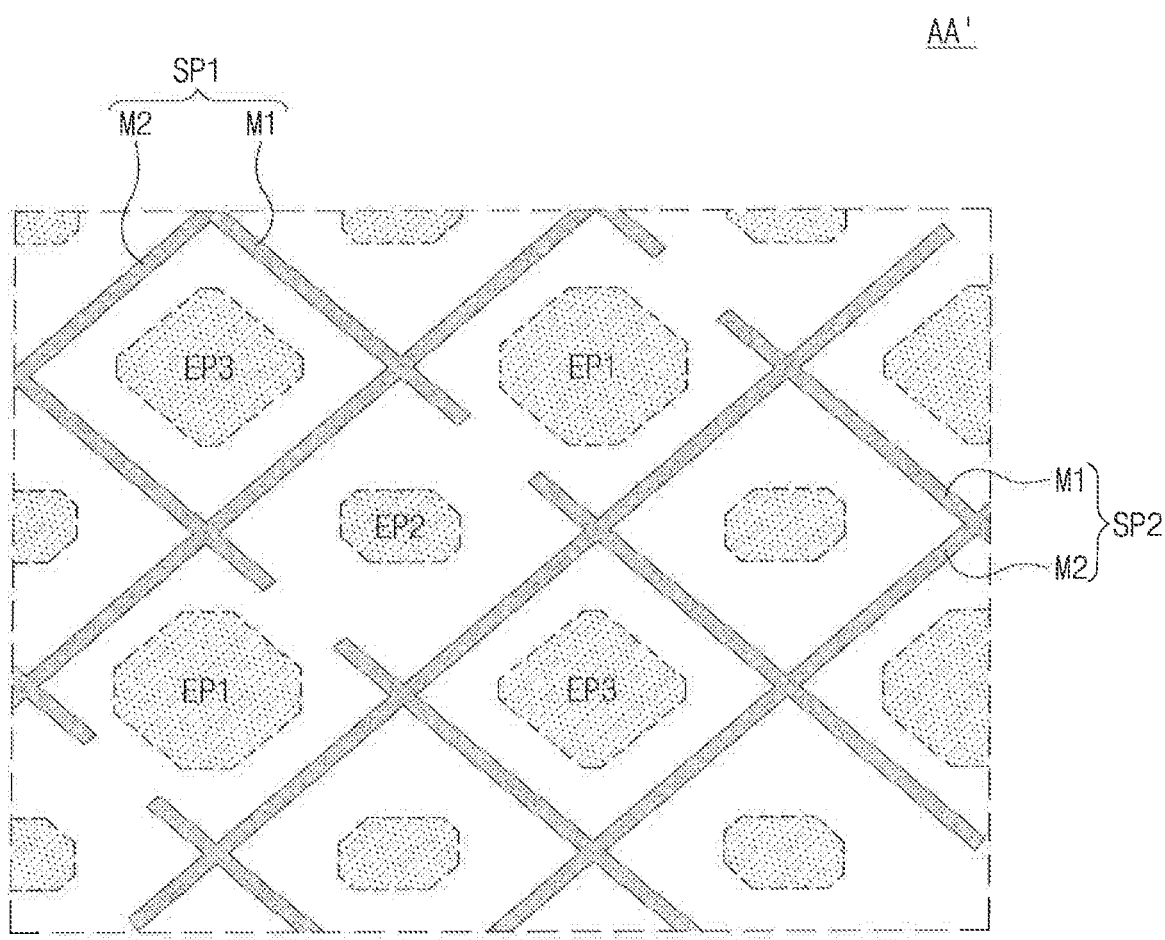
FIG. 7A is a plan view illustrating a region AA' of FIG. 3.
Figure 7B:
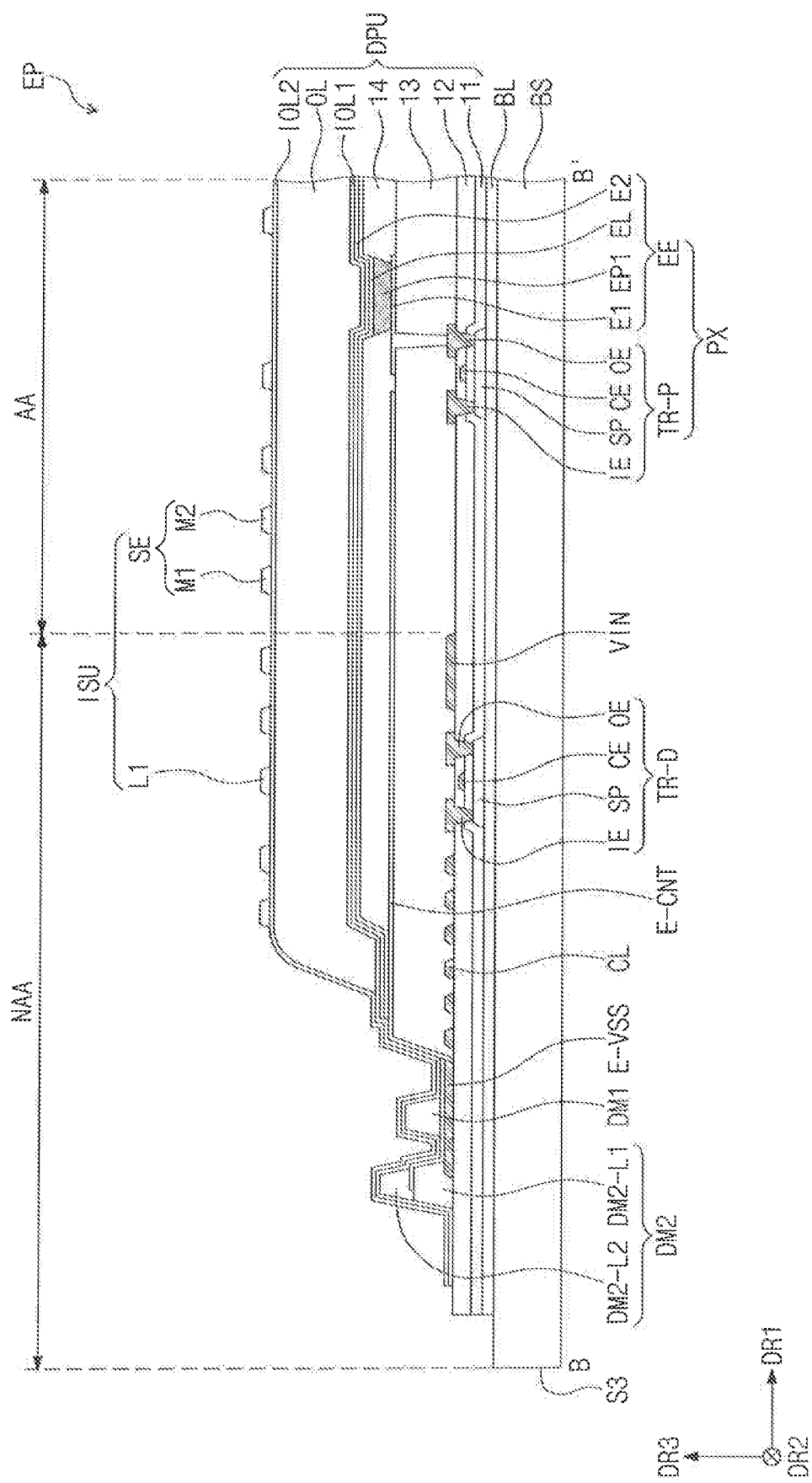
FIG. 7B is a cross-sectional view taken along line B-B' of FIG. 3.

FIG. 7A is a plan view illustrating region AA' of FIG. 3. FIG. 7B is a cross-sectional view taken along line B-B' of FIG. 3.

Hereinafter, an electronic panel according to an exemplary embodiment of the inventive concept will be described with reference to FIGS. 7A and 7B. For convenience of explanation, elements previously described with reference to FIGS. 1A to 6B may be identified by the same reference numerals, and a further description thereof may be omitted.

FIG. 7B illustrates a cross-sectional view of the electronic panel EP in a region including the third side S3. As shown in FIG. 7B, the electronic panel EP is illustrated to include both of the display panel unit DPU of FIG. 4A and the input sensing unit ISU of FIG. 4B. Hereinafter, an exemplary embodiment of the inventive concept will be described in more detail with reference to FIGS. 7A and 7B.

In the present exemplary embodiment, the input sensing unit ISU may be disposed on the display panel unit DPU. The display panel unit DPU may include the pixel PX and a plurality of insulating layers 11, 12, 13, and 14, and an encapsulation layer. The encapsulation layer may include a first inorganic layer IOL1, an organic layer OL, and a second inorganic layer IOL2.

The pixel PX may be disposed in the active region AA. The pixel PX may generate light constituting the image IM. In an exemplary embodiment, a plurality of the pixels PX may be arranged in the active region AA.

In FIG. 7B, one of thin film transistors (hereinafter, a pixel transistor TR-P) and the light-emitting element EE constituting the equivalent circuit diagram of the pixel PX shown in FIG. 4A are exemplarily illustrated. The pixel transistor TR-P may correspond to the second thin film transistor TR2 shown in FIG. 4A. Each of the first to third insulating layers 11, 12, and 13 may be formed of or include an organic material and/or an inorganic material, and may have a single-layered structure or a stacked structure.

The base substrate BS may be an insulating substrate. The base substrate BS may be a flexible substrate. For example, the base substrate BS may be formed of or include polyimide (PI). Alternatively, the base substrate BS may be a rigid substrate. The base substrate BS may be formed of or include various materials (e.g., glass or plastic materials). However, the inventive concept is not limited thereto.

In the present exemplary embodiment, the electronic panel EP may further include an auxiliary layer BL disposed on the base substrate BS. The auxiliary layer BL may be formed of or include an inorganic material. The auxiliary layer BL may include a barrier layer and/or a buffer layer. Accordingly, the auxiliary layer BL may prevent oxygen or moisture, which may enter through the base substrate BS, from entering the display panel unit DPU, or may reduce a surface energy of the base substrate BS, thereby allowing the display panel unit DPU to be stably formed on the base substrate BS.

The pixel transistor TR-P may include a semiconductor pattern SP, a control electrode CE, an input electrode IE, and an output electrode OE. The semiconductor pattern SP may be disposed on the auxiliary layer BL. The semiconductor pattern SP may be formed of or include a semiconductor material. The control electrode CE may be spaced apart from the semiconductor pattern SP with a first insulating layer 11 interposed therebetween. The control electrode CE may be connected to the first thin film transistor TR1 and an electrode of the capacitor CP described above.

The input electrode IE and the output electrode OE may be spaced apart from the control electrode CE with a second insulating layer 12 interposed therebetween. The input electrode IE and the output electrode OE of the pixel transistor TR-P may penetrate the first insulating layer 11 and the second insulating layer 12 and may be coupled to two opposite ends, respectively, of the semiconductor pattern SP.

A third insulating layer 13 may be disposed on the second insulating layer 12, and may cover the input electrode IE and the output electrode OE. In the pixel transistor TR-P, the semiconductor pattern SP may be disposed on the control electrode CE. In an exemplary embodiment, the semiconductor pattern SP may be disposed on the input electrode IE and the output electrode OE. In an exemplary embodiment, the input electrode IE and the output electrode OE may be disposed on the same layer as the semiconductor pattern SP and may be directly coupled to the semiconductor pattern SP. In an exemplary embodiment, the structure of the pixel transistor TR-P may be variously changed, and the inventive concept is not limited to a specific structure of the pixel transistor TR-P.

The light-emitting element EE may be disposed on the third insulating layer 13. In the present exemplary embodiment, an organic light emitting device is illustrated as an example of the light-emitting element EE. For example, the light-emitting element EE may include a first electrode E1, a light-emitting pattern EP1, a control layer EL, and a second electrode E2.

The first electrode E1 may be coupled to the pixel transistor TR-P through the third insulating layer 13. The electronic panel EP may further include an additional connection electrode disposed between the first electrode E1 and the pixel transistor TR-P. Here, the first electrode E1 may be electrically coupled to the pixel transistor TR-P through the connection electrode.

A fourth insulating layer 14 may be disposed on the third insulating layer 13. An opening may be defined in the fourth insulating layer 14. The opening may expose at least a portion of the first electrode E1. The fourth insulating layer 14 may be a pixel definition layer.

The light-emitting pattern EP1 may be disposed in the opening and may be disposed on the first electrode E1 exposed by the opening. The light-emitting pattern EP1 may be formed of or include a light-emitting material. For example, the light-emitting pattern EP1 may include at least one of materials capable of emitting red, green, and blue light, and may include a fluorescent or phosphorescent material. The light-emitting pattern EP1 may include an organic light emitting material or an inorganic light-emitting material. An intensity of light emitted from the light-emitting pattern EP1 may be determined by a potential difference between the first electrode E1 and the second electrode E2.

The control layer EL may be disposed between the first electrode E1 and the second electrode E2. The control layer EL may be disposed adjacent to the light-emitting pattern EP1. The control layer EL may control the movement of an electric charge to improve light-emitting efficiency and life span of the light-emitting element EE. The control layer EL may include at least one of a hole transport material, a hole injection material, an electron transport material, or an electron injection material.

In the present exemplary embodiment, the control layer EL is illustrated as being disposed between the light-emitting pattern EP1 and the second electrode E2. However, the inventive concept is not limited thereto. For example, in an exemplary embodiment, the control layer EL may be disposed between the light-emitting pattern EP1 and the first electrode E1, or may include a plurality of layers which are stacked in the third direction DR3 with the light-emitting pattern EP1 interposed therebetween.

The control layer EL may be provided in the form of a single body, which is extended from the active region AA to the peripheral region NAA. The control layer EL may be provided in common to a plurality of pixels.

The second electrode E2 may be disposed on the light-emitting pattern EP1. The second electrode E2 may face the first electrode E1. The second electrode E2 may be provided in the form of a single body, which is extended from the active region AA to the peripheral region NAA. The second electrode E2 may be provided in common to the plurality of pixels. The light-emitting elements EE, which are respectively disposed in the pixels PX, may receive a common power voltage (e.g., second power voltage VSS of FIG. 4A) through the second electrode E2.

The second electrode E2 may be formed of or include a transparent conductive material or a transflective conductive material. Thus, light generated by the light-emitting pattern EP1 may efficiently pass through the second electrode E2 and may propagate in the third direction DR3. However, the inventive concept is not limited thereto. For example, in an exemplary embodiment, the light-emitting element EE may be designed to have a back-side emission structure, in which the first electrode E1 includes a transparent or transflective material, or a double-side emission structure, which allows for light emission through top and bottom surfaces thereof.

The encapsulation layer may be disposed on the light-emitting element EE and may encapsulate the light-emitting element EE. The encapsulation layer may be provided in the form of a single body, which is extended from the active region AA to the peripheral region NAA. The encapsulation layer may be provided in common to the plurality of pixels. A capping layer may be further disposed between the second electrode E2 and the encapsulation layer and may cover the second electrode E2.

The encapsulation layer may include the first inorganic layer IOL1, the organic layer OL, and the second inorganic layer IOL2, which are sequentially stacked in the third direction DR3. However, the inventive concept is not limited thereto. For example, in an exemplary embodiment, the encapsulation layer may further include a plurality of inorganic layers and a plurality of organic layers.

The first inorganic layer IOL1 may cover the second electrode E2. The first inorganic layer IOL1 may prevent external moisture or oxygen from entering the light-emitting element EE. The first inorganic layer IOL1 may be formed of or include, for example, at least one of silicon nitride, silicon oxide, or compounds thereof. The first inorganic layer IOL1 may be formed by a deposition process.

The organic layer OL may be disposed on the first inorganic layer IOL1 and may be in contact with the first inorganic layer IOL1. The organic layer OL may be disposed on the first inorganic layer IOL1 to have a flat top surface. For example, the organic layer OL may cover the first inorganic layer IOL1 having an uneven top surface or particles on the first inorganic layer IOL1. As a result, exemplary embodiments may prevent the uneven surface profile of the first inorganic layer IOL1 or the particles from affecting elements on the organic layer OL. In addition, the organic layer OL may relieve stress between layers that are in contact with each other. The organic layer OL may be formed of or include an organic material and may be formed by a solution-based film-forming process (e.g., a spin coating process, a slit coating process, or an inkjet process).

The second inorganic layer IOL2 may be disposed on the organic layer OL and may cover the organic layer OL. By virtue of the organic layer OL having a relatively flat top surface, the second inorganic layer IOL2 may be formed in a more stable manner compared to the case of forming the second inorganic layer IOL2 on the first inorganic layer IOL1. The second inorganic layer IOL2 may encapsulate the organic layer OL, and as a result, may prevent moisture from being leaked from the organic layer OL to the outside. The second inorganic layer IOL2 may be formed of or include at least one of silicon nitride, silicon oxide, or compounds thereof. The second inorganic layer IOL2 may be formed by a deposition process.

The input sensing unit ISU may be disposed on the display panel unit DPU. The input sensing unit ISU may include a sensing electrode SE disposed in the active region AA and a sensing line L1 disposed in the peripheral region NAA. In the present exemplary embodiment, a portion of the first lines L1 shown in FIGS. 4B and 5A is illustrated as an example of the sensing line L1.

In the present exemplary embodiment, the input sensing unit ISU is illustrated as being directly disposed on the second inorganic layer IOL2. For example, the sensing electrode SE and the first lines L1 may be directly formed on the second inorganic layer IOL2. However, the inventive concept is not limited thereto. For example, in an exemplary embodiment, an additional insulating layer (e.g., a buffer layer) may be further disposed between the sensing electrode and first lines SE and L1 and the second inorganic layer IOL2. Furthermore, to protect the sensing electrode SE and the first lines L1, an insulating layer may be further disposed to cover the sensing electrode SE and the first lines L1.

The sensing electrode SE may include a plurality of conductive patterns M1 and M2. The conductive patterns M1 and M2 may be mesh patterns. Referring to FIG. 7B, the conductive patterns M1 and M2 may include a first mesh pattern M1 and a second mesh pattern M2 crossing each other.

As shown in FIG. 7A, the first sensing pattern SP1 and the second sensing pattern SP2 may be spaced apart from each other. Each of the first sensing pattern SP1 and the second sensing pattern SP2 may be implemented with the first and second mesh patterns M1 and M2.

Each of the first and second mesh patterns M1 and M2 may be formed of or include a conductive material. For example, each of the first and second mesh patterns M1 and M2 may be formed of or include at least one of metallic materials, transparent conductive oxides, or conductive polymers.

Each of the first and second mesh patterns M1 and M2 may be spaced apart from the light-emitting pattern EP1. For example, in an exemplary embodiment, each of the first and second mesh patterns M1 and M2 is not overlapped with the light-emitting pattern EP1 when viewed in a plan view. For convenience of illustration and description, in FIG. 7A, the light-emitting patterns EP1, EP2, and EP3 are illustrated by shaded patterns.

The light-emitting patterns EP1, EP2, and EP3 may emit light of different colors. The light-emitting pattern EP shown in FIG. 7B may be one of the light-emitting patterns EP1, EP2, and EP3 shown in FIG. 7A. The light-emitting patterns EP1, EP2, and EP3 may be provided to have various planar shapes according to the color of the light emitted therefrom. However, the inventive concept is not limited thereto. For example, in an exemplary embodiment, the light-emitting patterns EP1, EP2, and EP3 may have the same shape. In an exemplary embodiment, the light-emitting patterns EP1, EP2, and EP3 may be configured to emit light of the same color. However, the inventive concept is not limited thereto.

In an exemplary embodiment, because the sensing electrode SE is formed of mesh patterns M1 and M2, even if the sensing electrode SE is optically opaque, exemplary embodiments may prevent the sensing electrode SE from affecting display characteristics of the light-emitting patterns EP1, EP2, and EP3. However, the inventive concept is not limited thereto. For example, in an exemplary embodiment, the first and second mesh patterns M1 and M2 may be partially overlapped with the light-emitting patterns EP1, EP2, and EP3. In an exemplary embodiment, the first and second mesh patterns M1 and M2 may be optically transparent. In this case, the first and second mesh patterns M1 and M2 may be disposed to be overlapped with the light-emitting patterns EP1, EP2, and EP3.

Referring back to FIG. 7B, the electronic panel EP according to an exemplary embodiment of the inventive concept may further include a thin film transistor TR-D (hereinafter, a driving transistor), a plurality of signal patterns E-VSS, E-CNT, VIN, and CL, and a plurality of dam portions DM1 and DM2, which are disposed in the peripheral region NAA. The driving transistor TR-D and the signal patterns E-VSS, E-CNT, VIN, and CL may constitute the display panel unit DPU. The driving transistor TR-D may include a semiconductor pattern SP, a control electrode CE, an input electrode IE, and an output electrode OE.

The driving transistor TR-D is exemplarily illustrated to have a structure corresponding to the pixel transistor TR-P. For example, the driving transistor TR-D may include the semiconductor pattern SP disposed on the base substrate BS, the control electrode CE disposed on the first insulating layer 11, and the input electrode IE and the output electrode OE disposed on the second insulating layer 12. Accordingly, the pixel transistor TR-P and the driving transistor TR-D may be simultaneously formed by the same process, and thus, exemplary embodiments may simplify a fabrication process and reduce a process cost. However, the inventive concept is not limited thereto. For example, in an exemplary embodiment, the driving transistor TR-D may have a structure different from that of the pixel transistor TR-P.

The signal patterns E-VSS, E-CNT, VIN, and CL may include a power supplying line E-VSS, a connection electrode E-CNT, an initialization voltage line VIN, and a driving signal line CL. The power supplying line E-VSS may correspond to the power terminal VSS of the pixel PX. Accordingly, the power supplying line E-VSS may supply a second power voltage to the light-emitting element EE. In the present exemplary embodiment, the second power voltages supplied to the pixels PX may be a voltage that is supplied in common to all of the pixels PX.

The power supplying line E-VSS may be disposed on the second insulating layer 12. The power supplying line E-VSS may be simultaneously formed by the same process as that used for the input electrode IE or the output electrode OE of the driving transistor TR-D. However, the inventive concept is not limited thereto. For example, in an exemplary embodiment, the power supplying line E-VSS may be formed by a process different from that used for the input or output electrode IE or OE, and may be provided on a layer different than the input or output electrode IE or OE.

The connection electrode E-CNT may be disposed on the third insulating layer 13. The connection electrode E-CNT may be electrically coupled to the power supplying line E-VSS. The connection electrode E-CNT may be extended from the top surface of the third insulating layer 13 to cover a top surface of the power supplying line E-VSS exposed by the third insulating layer 13.

The second electrode E2 of the light-emitting element EE may be extended from the active region AA and may be coupled to the connection electrode E-CNT. The active region AA may refer to a region in which an image may be displayed. The connection electrode E-CNT may receive the second power voltage from the power supplying line E-VSS. Accordingly, the second power voltage may be transferred to the second electrode E2 through the connection electrode E-CNT and may be provided to each of the pixels PX.

The connection electrode E-CNT may be disposed on the same layer as the first electrode E1 of the light-emitting element EE and may be simultaneously formed with the first electrode E1. However, the inventive concept is not limited thereto. For example, in an exemplary embodiment, the connection electrode E-CNT and the first electrode E1 may be disposed on different layers.

In an exemplary embodiment, a plurality of the driving signal lines CL may be disposed on the second insulating layer 12. The driving signal line CL may be disposed in a peripheral region NAA. The driving signal line CL may be a routing line connected to a pad or a line constituting an integrated circuit (IC). The driving signal lines CL may be spaced apart from each other in the first direction DR1 and may transfer respective electrical signals in an independent manner.

The initialization voltage line VIN may be disposed in the active region AA and may provide an initialization voltage to the pixel PX. A plurality of the initialization voltage lines VIN may be provided and may be used to provide an initialization voltage to each of a plurality of pixels PX.

The driving signal line CL and the initialization voltage line VIN may be disposed on the same layer and may be simultaneously formed by the same process. However, the inventive concept is not limited thereto. For example, in an exemplary embodiment, the driving signal line CL and the initialization voltage line VIN may be formed independently through different processes.

The dam portions DM1 and DM2 may be provided in the peripheral region NAA. The dam portions DM1 and DM2 may prevent the organic layer OL from overflowing from the active region AA to a region outside the dam portions DM1 and DM2 (e.g., toward the third side S3 in FIG. 7B) when the organic layer OL of the encapsulation layer is formed in the active region AA. The dam portions DM1 and DM2 may be disposed adjacent to at least one of sides of the active region AA. The dam portions DM1 and DM2 may enclose the active region AA when viewed in a plan view. The dam portions DM1 and DM2 may include a plurality of dam portions (e.g., a first dam portion DM1 and a second dam portion DM2).

The first dam portion DM1 may be closer to the active region AA than the second dam portion DM2. The first dam portion DM1 may be overlapped with the power supplying line E-VSS when viewed in a plan view. In the present exemplary embodiment, the connection electrode E-CNT may include a portion that is provided between the first dam portion DM1 and the power supplying line E-VSS when viewed in a cross-sectional view.

In the present exemplary embodiment, the first dam portion DM1 may include the same material as the fourth insulating layer 14 and may be simultaneously formed using the same mask as that used for the fourth insulating layer 14. In this case, an additional process for forming the first dam portion DM1 may be omitted. As a result, exemplary embodiments may simplify the fabrication process and reduce the process cost.

The second dam portion DM2 may be disposed at a relatively outer region compared to the first dam portion DM1. The second dam portion DM2 may cover a portion of the power supplying line E-VSS. In an exemplary embodiment, the second dam portion DM2 may have a double-layered structure including a first layer DM2-L1 and a second layer DM2-L2. For example, the first layer DM2-L1 and the third insulating layer 13 may be formed at the same time, and the second layer DM2-L2 and the fourth insulating layer 14 may be formed at the same time. Accordingly, the second dam portion DM2 may be efficiently formed without an additional process.

In the present exemplary embodiment, the connection electrode E-CNT may be overlapped with a portion of the first layer DM2-L1 of the second dam portion DM2. An end portion of the connection electrode E-CNT may be inserted in a region between the first layer DM2-L1 and the second layer DM2-L2. However, the inventive concept is not limited thereto. For example, in an exemplary embodiment, the connection electrode E-CNT is not extended to the second dam portion DM2.

The first inorganic layer IOL1 and the second inorganic layer IOL2 may be extended from the active region AA to a region outside the second dam portion DM2. The first inorganic layer IOL1 and the second inorganic layer IOL2 may cover the first dam portion DM1 and the second dam portion DM2. The organic layer OL may be disposed within a region enclosed by the second dam portion DM2. However, the inventive concept is not limited thereto. For example, in an exemplary embodiment, a portion of the organic layer OL may be extended to a region overlapped with the first dam portion DM1.

Figure 8A:
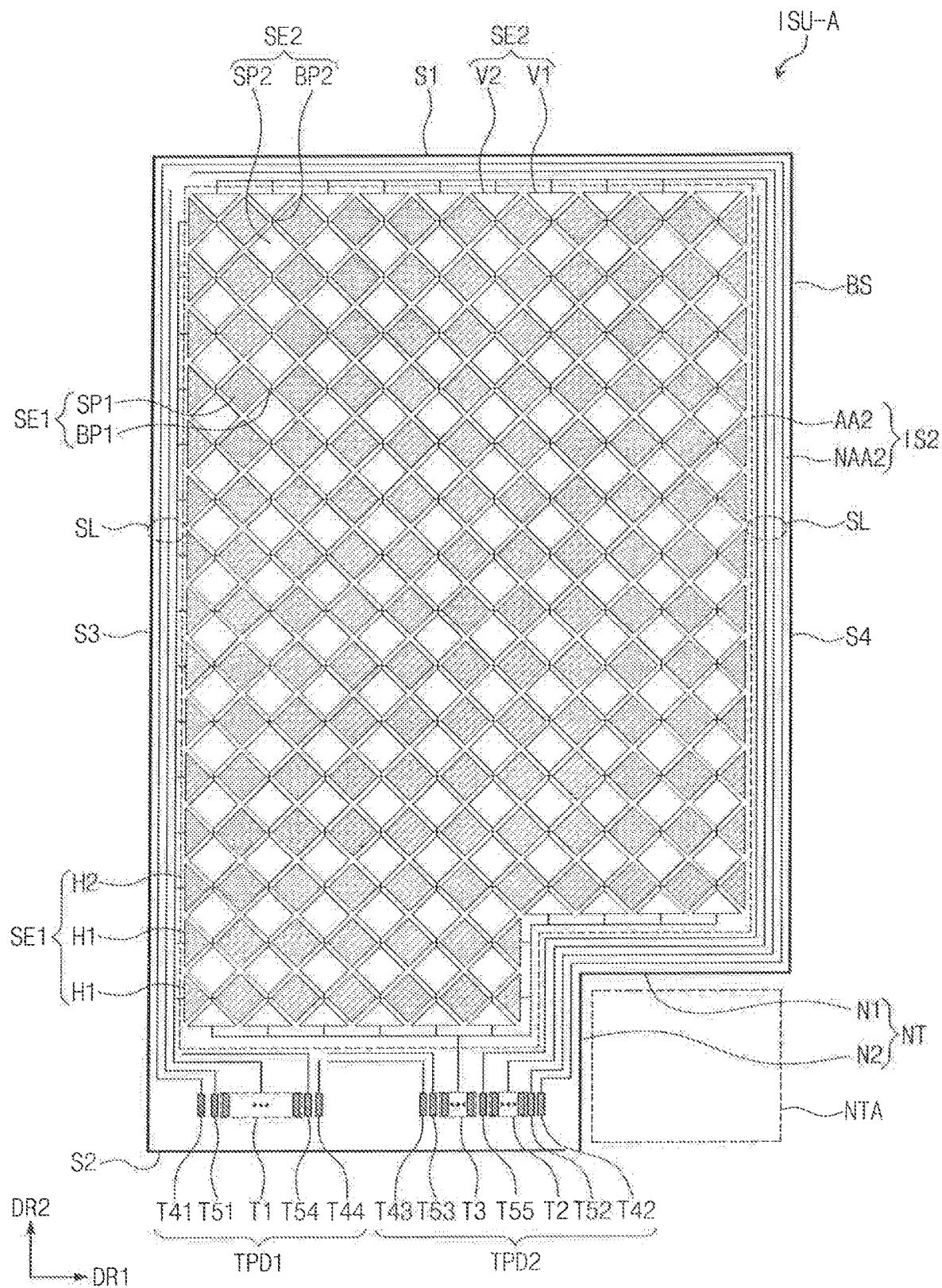
FIGS. 8A and 8B are plan views, each of which illustrates an electronic panel according to an embodiment of the inventive concept.
Figure 8B:
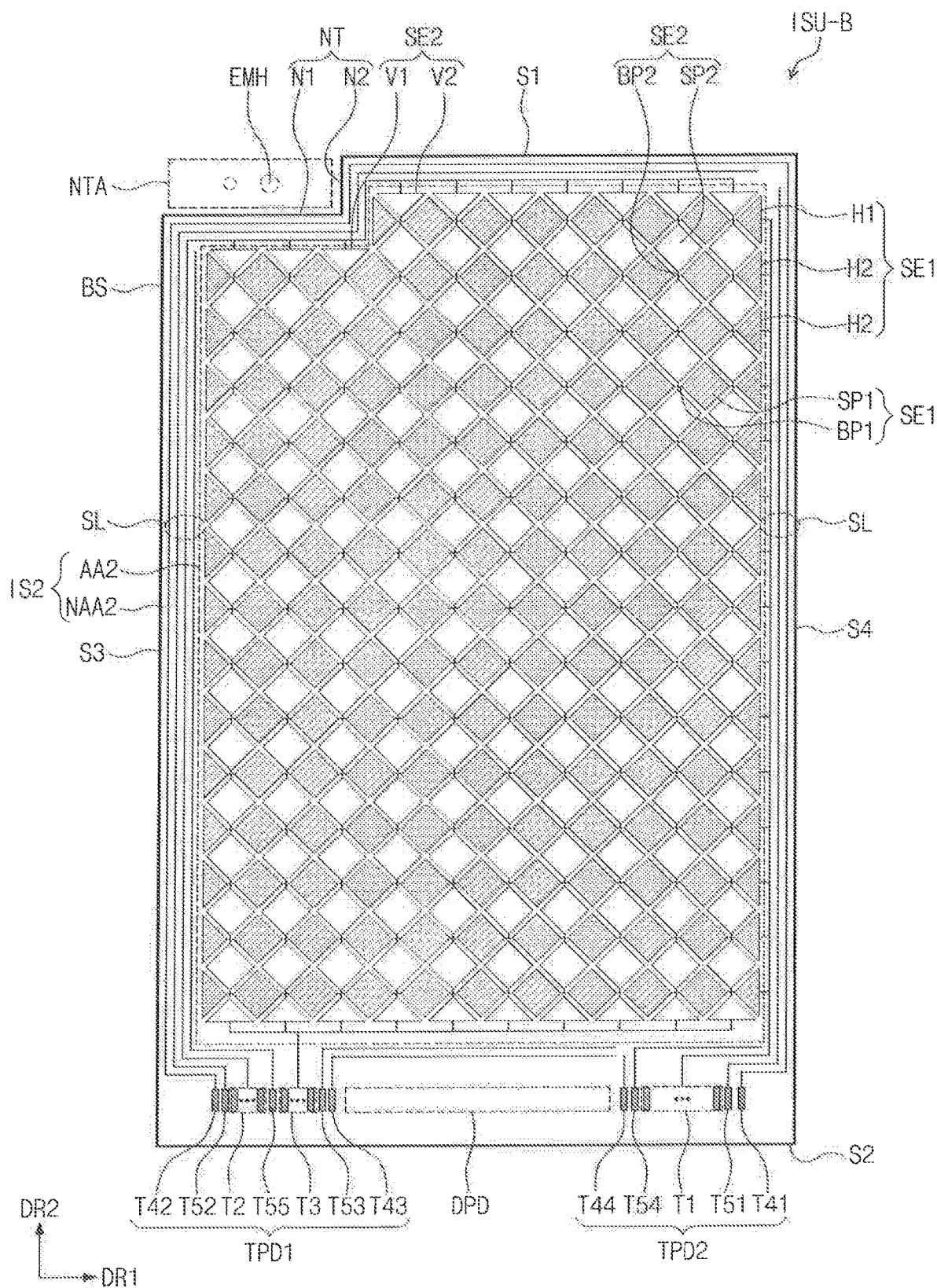

FIGS. 8A and 8B are plan views, each of which illustrates an electronic panel according to an exemplary embodiment of the inventive concept. For convenience of illustration and description, plan views of input sensing units ISU-A and ISU-B are illustrated in FIGS. 8A and 8B, and moreover, the plan views of FIGS. 8A and 8B illustrate a region corresponding to FIG. 4B. For convenience of explanation, elements previously described with reference to FIGS. 1A to 7 may be identified by the same reference numerals, and a further description thereof may be omitted.

As shown in FIG. 8A, the notch region NTA may be defined in a right bottom region of the input sensing unit ISU-A. The notch portion NT is illustrated to be defined at a position adjacent to the input sensing pads TPD1 and TPD2.

The first sensing electrode SE1 according to the present exemplary embodiment may include a plurality of the first row electrodes H1. In an exemplary embodiment, two of the first row electrodes H1 may be disposed adjacent to the second notch side N2 to face the notch region NTA.

In the second sensing electrode SE2, the lower end of the first column electrode V1 may face the notch region NTA.

Accordingly, some of signal lines SL connected to the third sensing pad T3 may be extended along the first notch side N1 and the second notch side N2, and may be connected to the third sensing pad T3. Others of the signal lines SL connected to the first sensing pad T1 may be connected to the left end of the first row electrode H1 and may be spaced apart from the notch region NTA. Accordingly, in an exemplary embodiment, the signal lines SL are not overlapped with each other in a plan view, and thus, exemplary embodiments may prevent sensitivity of the input sensing units ISU-A and ISU-B from being deteriorated due to such overlapping. As a result, noise may be prevented or reduced.

As shown FIG. 8B, the notch region NTA may be defined in a left top region of the input sensing unit ISU-B. The input sensing unit ISU-B may have substantially a mirror-symmetric structure with the input sensing unit ISU-B of FIG. 4B about a plane parallel to the second direction DR2. Thus, for convenience of explanation, a further description of the input sensing unit ISU-B will be omitted.

In an exemplary embodiment, the notch portion NT may be defined in various regions of the input sensing unit ISU-A or ISU-B. According to an exemplary embodiment of the inventive concept, exemplary embodiments may prevent the signal lines SL from being overlapped with each other in the notch portion NT when viewed in a plan view. Accordingly, exemplary embodiments may prevent noise from being formed between the signal lines SL transferring different electrical signals, and thus, sensitivity of the input sensing unit ISU-A or ISU-B may be prevented from being deteriorated.

Figure 9A:
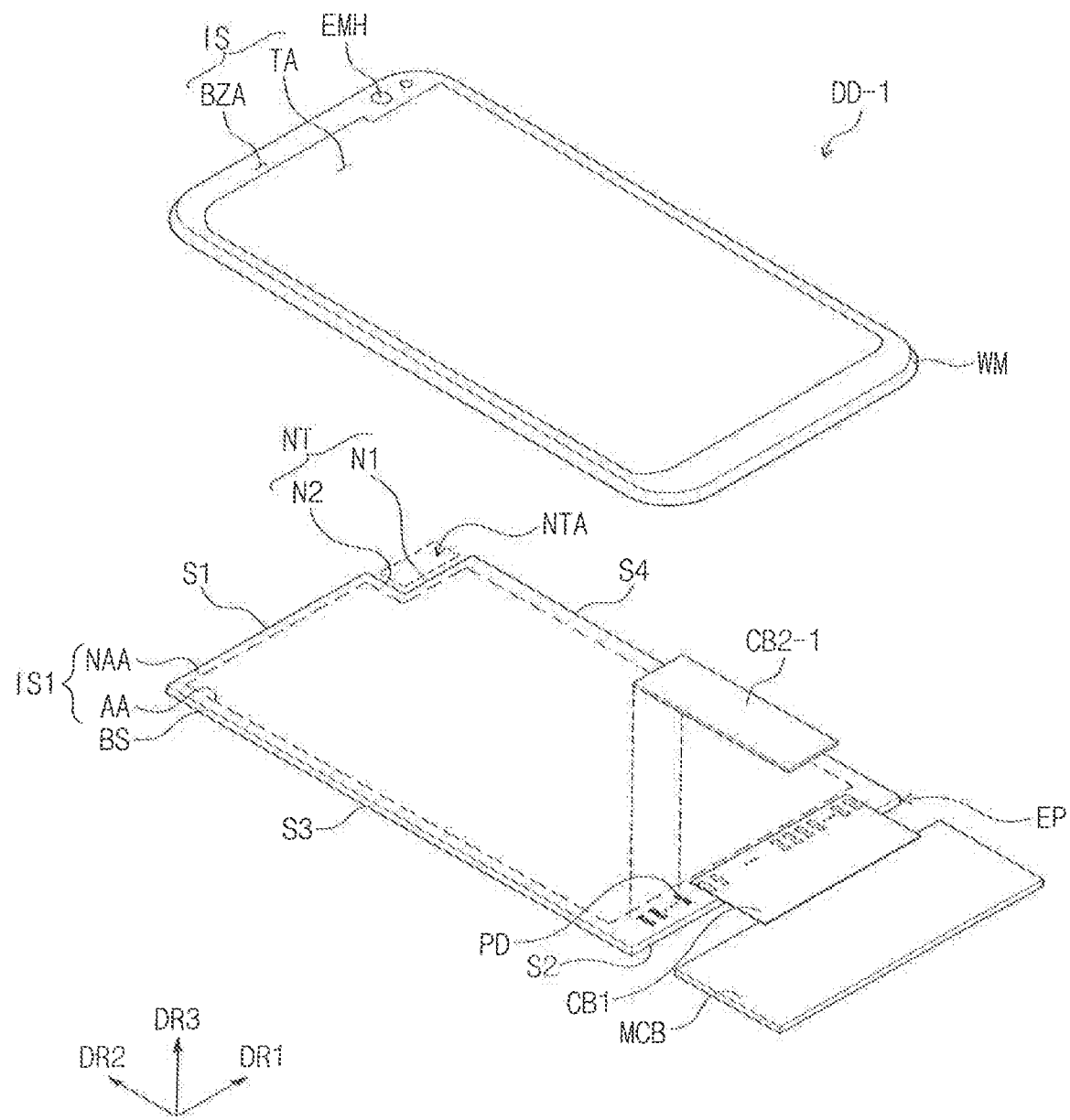
FIG. 9A is an exploded perspective view illustrating a display device according to an exemplary embodiment of the inventive concept.
Figure 9B:
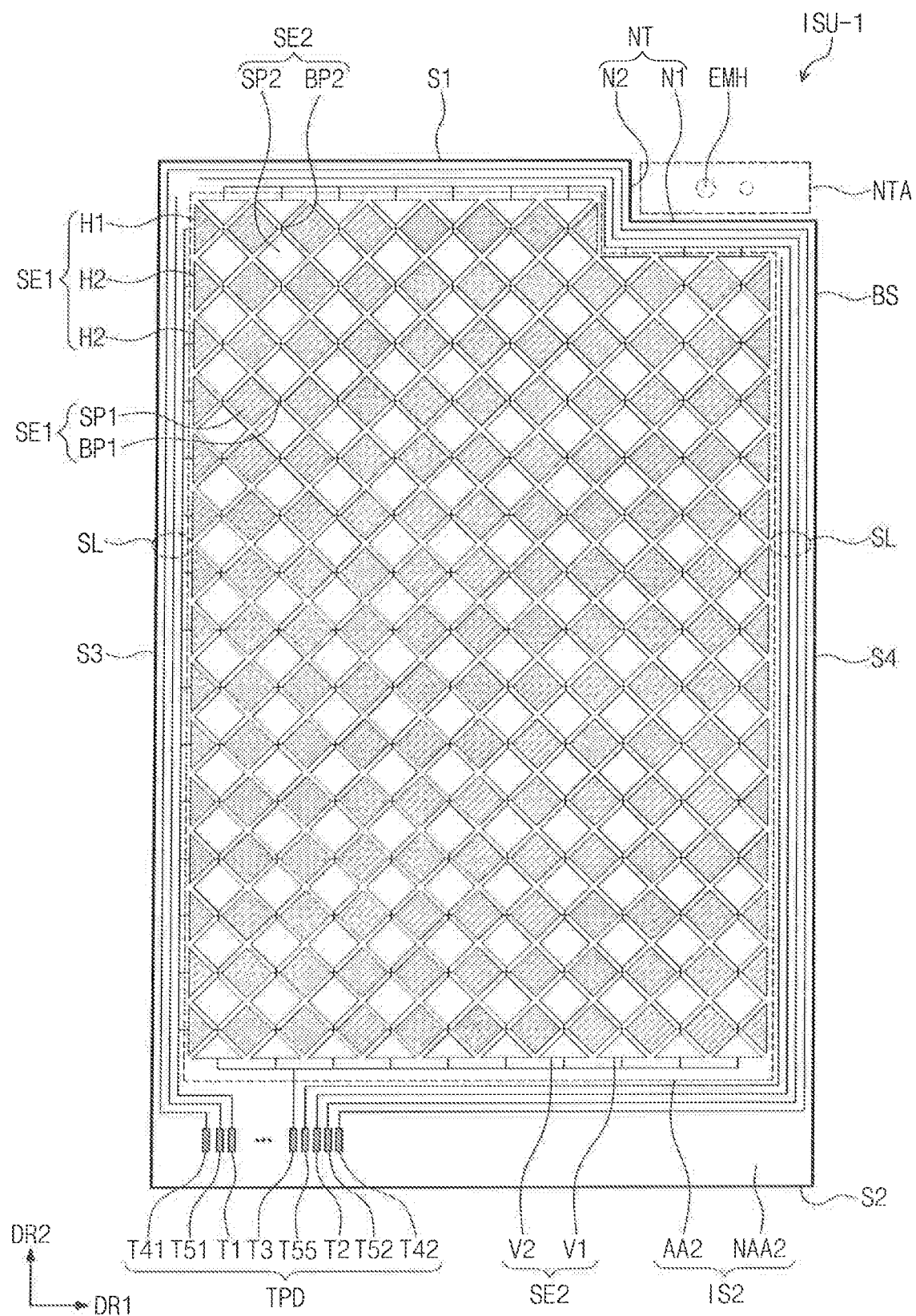
FIG. 9B is a plan view illustrating some elements shown in FIG. 9A.

FIG. 9A is an exploded perspective view illustrating a display device according to an exemplary embodiment of the inventive concept. FIG. 9B is a plan view illustrating some elements shown in FIG. 9A. For convenience of illustration and description, a plan view of an input sensing unit ISU-1 is illustrated in FIG. 9B.

Hereinafter, a display device according to an exemplary embodiment of the inventive concept will be described with reference to FIGS. 9A and 9B. For convenience of explanation, elements previously described with reference to FIGS. 1A to 8B may be identified by the same reference numerals, and a further description thereof may be omitted.

In a display device DD-1 shown in FIGS. 9A and 9B, the pads PD may include the input sensing pads TPD, which are disposed near the display panel pads DPD (see FIG. 4B). Except for the positions of the input sensing pads TPD, other elements of the input sensing unit ISU-1 may be configured to have substantially the same features as those of the input sensing unit ISU of FIG. 4B. Thus, for convenience of illustration and description, elements previously described with reference to FIG. 4B may be identified by the same reference numerals, and a further description thereof may be omitted.

The input sensing pads TPD may be adjacent to the display panel pads DPD in a direction opposite to the first direction DR1. Unlike the electronic panel EP of FIG. 3, the input sensing pads TPD may be disposed in a single region in the electronic panel EP-1.

Accordingly, a second circuit board CB2-1 may have a rectangular shape, which is extended in the second direction DR2. The second circuit board CB2-1 may be stably connected to the input sensing unit ISU-1, although the second circuit board CB2-1 does not have a plurality of circuit portions.

In an exemplary embodiment, since an integration density of the input sensing pads TPD is increased in a specific region, the input sensing unit ISU-1 may be efficiently assembled to the second circuit board CB2-1.

Figure 10A:
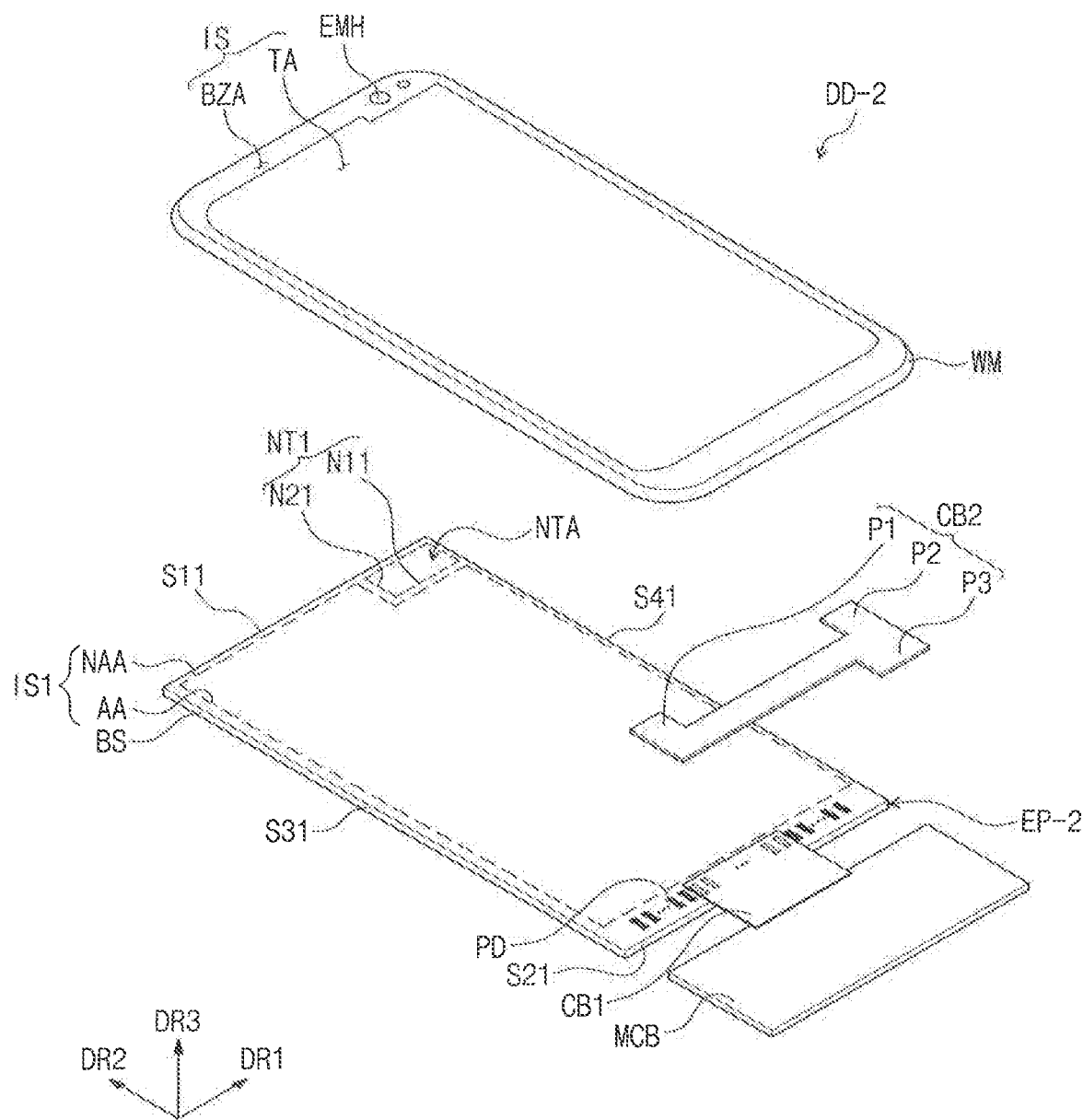
FIG. 10A is an exploded perspective view illustrating a display device according to an exemplary embodiment of the inventive concept.
Figure 10B:
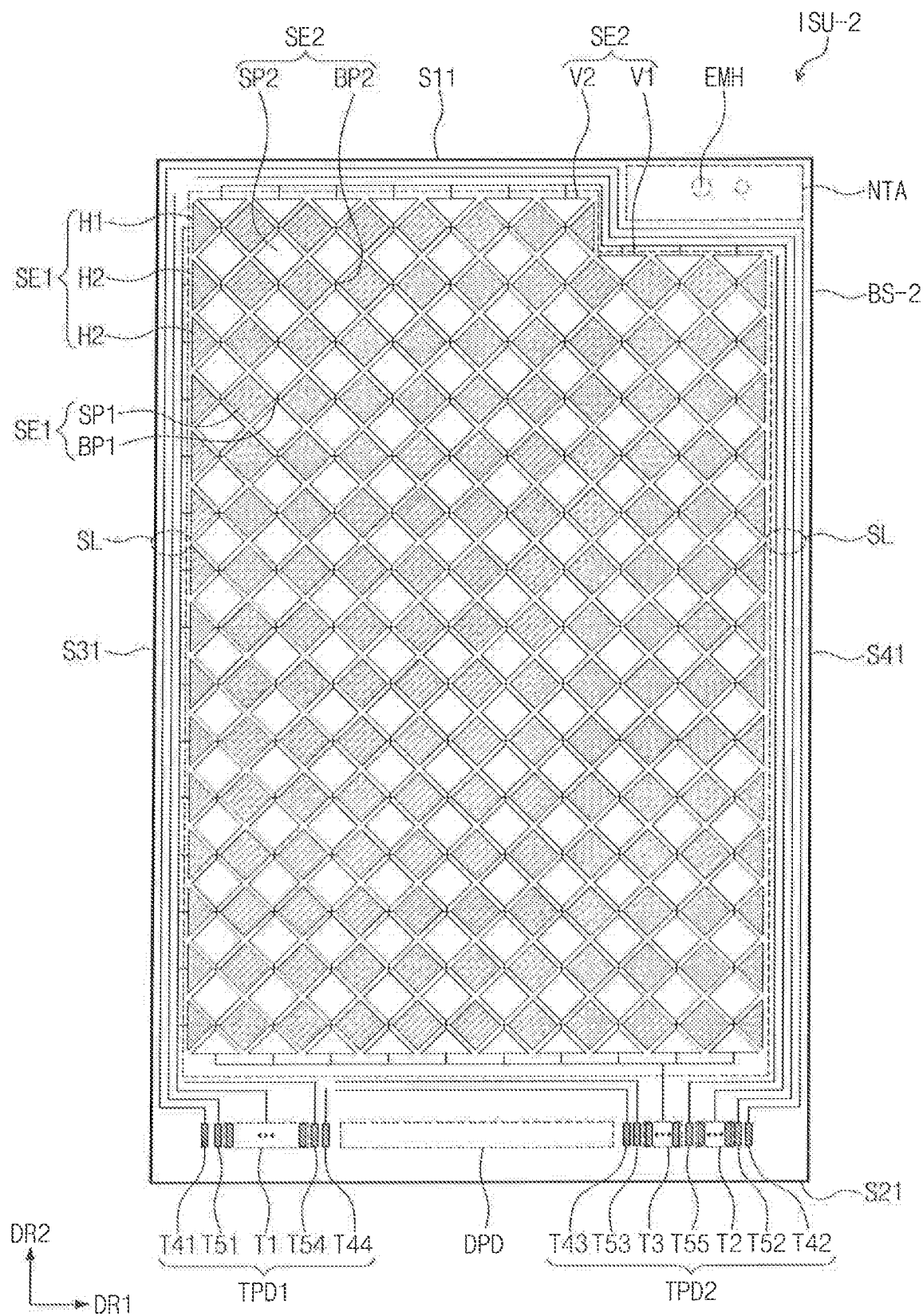
FIG. 10B is a plan view illustrating some elements shown in FIG. 10A.

FIG. 10A is an exploded perspective view illustrating a display device according to an exemplary embodiment of the inventive concept. FIG. 10B is a plan view illustrating some elements shown in FIG. 10A. For convenience of illustration and description, a plan view of an input sensing unit ISU-2 is illustrated in FIG. 10B.

Hereinafter, a display device according to an exemplary embodiment of the inventive concept will be described with reference to FIGS. 10A and 10B. For convenience of explanation, elements previously described with reference to FIGS. 1A to 9B may be identified by the same reference numerals, and a further description thereof may be omitted.

In a display device DD-2 shown in FIGS. 10A and 10B, the pads PD may include the input sensing pads TPD1 and TPD2, which are disposed near the display panel pads DPD. Except for the positions of the input sensing pads TPD1 and TPD2, other elements of the input sensing unit ISU-2 may be configured to have substantially the same features as those of the input sensing unit ISU of FIG. 4B. Thus, for convenience of explanation, elements previously described with reference to FIG. 4B may be identified by the same reference numerals, and a further description thereof may be omitted.

As shown in FIGS. 10A and 10B, an electronic panel EP-2 may have a rectangular or tetragonal shape including a first side S11, a second side S21, a third side S31, and a fourth side S41. For example, in the electronic panel EP-2 according to the present exemplary embodiment, there is no notch portion connected to any of the first side S11, the second side S21, the third side S31, and the fourth side S41.

However, in the electronic panel EP-2, there may be a notch portion NT1 in the active region AA. The notch portion NT1 may include a first notch side N11 and a second notch side N21, which are connected to each other. For example, a base substrate BS-2 may have a rectangular plate shape whose two sides are extended in the first direction DR1 and whose other two sides are extended in the second direction DR2, and the input sensing unit ISU-2 may be designed to be provided along the notch portion NT1, which is defined in a region of the active region AA. Accordingly, in an exemplary embodiment, in the input sensing unit ISU-2, the first sensing electrode SE1, the second sensing electrode SE2, and the signal lines SL are not provided in the notch region NTA. The input sensing unit ISU-2 may be provided in a region whose shape is different from that of the base substrate BS-2.

The notch region NTA may be transparent. For example, elements constituting the display panel unit DPU (e.g., see FIG. 4A) may not be disposed in the notch region NTA. Here, the notch region NTA may correspond to an optically transparent region and may be a region which is not activated by an electrical signal.

In an exemplary embodiment, some of the pixels PX (e.g., see FIG. 4A) may be disposed in the notch region NTA. In this case, in an exemplary embodiment, the notch region NTA is not used to sense an external input but may be used to display an image.

In an exemplary embodiment, the input sensing unit ISU-2 may include sensing electrodes, which are arranged in various shapes, regardless of the shape of the base substrate BS-2. Furthermore, the input sensing unit ISU-2 may be configured to provide a sensing region to a user. The shape of the sensing region may be variously changed.

In an exemplary embodiment, positions of the signal lines SL in the input sensing unit ISU-2 may be designed to prevent the signal lines SL from being overlapped with each other in a plan view. Thus, exemplary embodiments may prevent noise from being produced by overlapping signal lines SL, regardless of the shape of the electronic panel EP-2. As a result, exemplary embodiments may provide an electronic device, which can sense an external input with improved sensitivity, to a user.

Signal lines may be provided in an input sensing unit and may be used to transmit different electrical signals. According to an exemplary embodiment of the inventive concept, noise may be prevented from occurring between the signal lines overlapped with each other in a plan view. Furthermore, in an electronic device providing an irregular active region, the signal lines may be disposed to reduce an overlapping area therebetween, and thus, sensitivity in a step of sensing an external input may be prevented from decreasing.

While the inventive concept has been particularly shown and described with reference to the exemplary embodiments thereof, it will be understood by one of ordinary skill in the art that variations in form and detail may be made therein without departing from the spirit and scope of the inventive concept as defined by the following claims.

What is claimed is:

1. An electronic device, comprising:
a plurality of row electrodes extending in a first direction and arranged in a second direction crossing the first direction,
wherein the plurality of row electrodes comprises a first row electrode and a second row electrode disposed adjacent to each other in the second direction,
wherein the first row electrode comprises an end and an opposite end opposing the end of the first row electrode, and the second row electrode comprises an end aligned with the end of the first row electrode along the second direction and an opposite end opposing the end of the second row electrode,
wherein the first row electrode has a first length in the first direction, the second row electrode has a second length in the first direction, and the second length is longer than the first length;
a plurality of column electrodes extending in the second direction and arranged in the first direction,
wherein the plurality of column electrodes comprises a first column electrode and a second column electrode disposed adjacent to each other in the first direction,
wherein the first column electrode comprises an end and an opposite end opposing the end of the first column electrode, and the second column electrode comprises an end and an opposite end opposing the end of the second column electrode and aligned with the opposite end of the first column electrode along the first direction,
wherein the first column electrode has a third length in the second direction, the second column electrode has a fourth length in the second direction, and the fourth length is longer than the third length;
a plurality of first lines connected to a corresponding end of the first row electrode and the end of the second row electrode;
a plurality of second lines connected to a corresponding end of the first column electrode and the end of the second column electrode; and
a plurality of third lines connected to a corresponding opposite end of the first column electrode and the opposite end of the second column electrode, wherein the first to third lines are spaced apart from each other when viewed in a plan view,
wherein a portion of each of the plurality of second lines faces the opposite end of the first row electrode.

2. The electronic device of claim 1, wherein the first lines and the second lines are disposed on a same layer.

3. The electronic device of claim 2, wherein each of the row electrodes comprises a plurality of first sensing patterns arranged in the first direction and a plurality of first bridge patterns connecting the first sensing patterns to each other,
each of the column electrodes comprises a plurality of second sensing patterns arranged in the second direction and a plurality of second bridge patterns disposed on a different layer than the first bridge patterns and connecting the second sensing patterns to each other, and
the second lines and the second sensing patterns are disposed on a same layer.

4. The electronic device of claim 3, wherein each of the second lines and each of the second sensing patterns connected to the second lines have an integral shape.

5. The electronic device of claim 3, wherein the second lines are disposed on a same layer as one of the first bridge patterns and the second bridge patterns.

6. The electronic device of claim 1, further comprising:
a reference line receiving a voltage different from those of the first lines to third lines,
wherein the reference line is spaced apart from the first to third lines when viewed in the plan view.

7. The electronic device of claim 6, further comprising:
a guard line receiving a voltage different from those of the first lines, the second lines, the third lines, and the reference line,
wherein the guard line comprises at least one of:
a first guard line disposed between one of the first lines and one of the second lines which are adjacent to each other;
a second guard line disposed between the reference line and one of the first lines adjacent to the reference line;
a third guard line disposed between the reference line and one of the second lines adjacent to the reference line; and
a fourth guard line disposed between the row electrodes and one of the second lines adjacent to the row electrodes.

8. The electronic device of claim 7, wherein the fourth guard line is spaced apart from the opposite end of the first row electrode and is adjacent to the opposite end of the second row electrode.

9. The electronic device of claim 1, further comprising:
a display panel unit that display an image;
a plurality of first pads connected to the first lines, respectively;
a plurality of second pads connected to the second lines, respectively;
a plurality of third pads connected to the third lines, respectively; and
a plurality of display pads connected to the display panel unit.

10. The electronic device of claim 9, wherein the first pads and the second pads are spaced apart from each other in the first direction with the display pads interposed therebetween, and are respectively disposed on two opposite sides of a display pad region in which the display pads are disposed.

11. The electronic device of claim 9, wherein the first pads and the second pads are disposed on one side of a display pad region in which the display pads are disposed.

12. The electronic device of claim 1, wherein a notch region, which faces the opposite end of the first row electrode and the end of the second column electrode, is spaced apart from the column electrodes and the row electrodes when viewed in the plan view.

13. The electronic device of claim 12, wherein the notch region has a length corresponding to a difference between the first length and the second length in the first direction, and a width corresponding to a difference between the third length and the fourth length in the second direction.

14. The electronic device of claim 13, wherein an image is not displayed in the notch region.

15. An electronic device, comprising:
an electronic panel, in which a notch portion providing a notch region is defined; and
an electronic component overlapped with the notch region when viewed in a plan view,
wherein the electronic panel comprises:
a first row electrode extending in a first direction and comprising an end and an opposite end, wherein the opposite end of the first row electrode is opposite to the end of the first row electrode and is adjacent to the notch portion;
a first column electrode extending in a second direction crossing the first direction and comprising an end adjacent to the notch portion and an opposite end opposite to the end of the first column electrode;
a first sensing line connected to the first row electrode;
a second sensing line connected to the end of the first column electrode; and
a third sensing line connected to the opposite end of the first column electrode,
wherein the first sensing line is connected to the end of the first row electrode and is spaced apart from the second sensing line and the third sensing line in the plan view,
wherein a portion of the second sensing line faces the opposite end of the first row electrode.

16. The electronic device of claim 15, wherein at least a portion of the second sensing line is adjacent to the notch portion.

17. The electronic device of claim 15, wherein at least a portion of the second sensing line is adjacent to the opposite end of the first row electrode.

18. The electronic device of claim 15, wherein the first sensing line and the second sensing line are disposed on a same layer.

19. The electronic device of claim 18, wherein the first row electrode comprises a plurality of first sensing patterns arranged in the first direction and a plurality of first bridge patterns connecting the first sensing patterns to each other,
the first column electrode comprises a plurality of second sensing patterns arranged in the second direction and a plurality of second bridge patterns disposed on a different layer than the first bridge patterns and connecting the second sensing patterns to each other,
the first sensing line and the first sensing pattern are disposed on a same layer, and
the second sensing line and the second sensing pattern are disposed on a same layer.

20. The electronic device of claim 19, wherein the first sensing line and at least one of the first sensing patterns have an integral shape.

21. The electronic device of claim 19, wherein the first sensing line covers at least a portion of at least one of the first sensing patterns.

22. The electronic device of claim 15, wherein the electronic device comprises a base substrate, and the base substrate comprises:
- a first side and a second side extending parallel to each other and facing each other; and
- a third side and a fourth side extending parallel to each other and facing each other,
- wherein the first and second sides extend in the first direction, the third and fourth sides extend in the second direction, the notch portion is connected to the first side and the fourth side, the first side has a length shorter than the second side, and the fourth side has a length shorter than the third side.

23. The electronic device of claim 15, wherein the electronic component comprises at least one of a camera component, a sound output component, a light-receiving component, and a light-emitting component.

24. An electronic device, comprising:
- an electronic panel, in which a notch portion providing a notch region is defined,
- wherein the electronic panel comprises a display panel unit that displays an image and an input sensing unit disposed on the display panel unit; and
- an electronic component overlapped with the notch region when viewed in a plan view,
- wherein the input sensing unit comprises:
  - a first electrode extending in a first direction and comprising an end adjacent to the notch portion and an opposite end opposite to the end of the first electrode;
  - a second electrode extending in a second direction crossing the first electrode and comprising an end adjacent to the notch portion and an opposite end opposite to the end of the second electrode;
  - a first sensing line connected to the opposite end of the first electrode; and
  - a second sensing line connected to the second electrode,
- wherein the first sensing line is spaced apart from the notch portion with the first electrode interposed therebetween, and the second sensing line is disposed between the notch portion and the second electrode,
- wherein a portion of the second sensing line faces the end of the first electrode.

25. The electronic device of claim 24, further comprising:
- a third sensing line connected to the second electrode,
- wherein the third sensing line is spaced apart from the notch portion and is connected to the opposite end of the second electrode.

26. The electronic device of claim 25, wherein the first to third sensing lines are not overlapped with each other when viewed in the plan view.

27. The electronic device of claim 25, wherein the first sensing line and the second sensing line are disposed on a same layer.

28. The electronic device of claim 27, further comprising:
- a plurality of display panel pads connected to the display panel unit;
- a first pad connected to the first sensing line;
- a second pad connected to the second sensing line; and
- a third pad connected to the third sensing line,
- wherein the first to third pads are disposed on one side of a region in which the display panel pads are disposed.

29. The electronic device of claim 27, further comprising:
- a plurality of display panel pads connected to the display panel unit;
- a first pad connected to the first sensing line;
- a second pad connected to the second sensing line; and
- a third pad connected to the third sensing line,
- wherein the first pad is spaced apart from at least one of the second pad and the third pad, with the display panel pads interposed therebetween.

* * * * *